(12) United States Patent
VanGordon

(10) Patent No.: US 10,903,063 B2
(45) Date of Patent: Jan. 26, 2021

(54) METHODS FOR CONFIRMING CHARGED-PARTICLE GENERATION IN AN INSTRUMENT, AND RELATED INSTRUMENTS

(71) Applicant: bioMerieux, Inc., Durham, NC (US)

(72) Inventor: James Arthur VanGordon, O'Fallon, MO (US)

(73) Assignee: bioMérieux, Inc., Durham, NC (US)

( * ) Notice: Subject to any disclaimer, the term of this patent is extended or adjusted under 35 U.S.C. 154(b) by 0 days.

(21) Appl. No.: 16/272,621

(22) Filed: Feb. 11, 2019

(65) Prior Publication Data

US 2019/0252176 A1 Aug. 15, 2019

Related U.S. Application Data

(60) Provisional application No. 62/629,854, filed on Feb. 13, 2018.

(51) Int. Cl.

| | |
|---|---|
| *H01J 49/16* | (2006.01) |
| *H01J 49/40* | (2006.01) |
| *H01J 37/244* | (2006.01) |
| *H01J 49/04* | (2006.01) |
| *H01J 49/06* | (2006.01) |
| *H01J 49/00* | (2006.01) |
| *H01J 49/02* | (2006.01) |

(52) U.S. Cl.
CPC .......... *H01J 49/164* (2013.01); *H01J 37/244* (2013.01); *H01J 49/0027* (2013.01); *H01J 49/025* (2013.01); *H01J 49/027* (2013.01); *H01J 49/0418* (2013.01); *H01J 49/06* (2013.01); *H01J 49/403* (2013.01)

(58) Field of Classification Search
CPC ...... H01J 49/0027; H01J 49/06; H01J 49/164; H01J 49/403
See application file for complete search history.

(56) References Cited

U.S. PATENT DOCUMENTS

| | | |
|---|---|---|
| 5,160,840 A | 11/1992 | Vestal |
| 5,382,793 A | 1/1995 | Weinberger et al. |

(Continued)

FOREIGN PATENT DOCUMENTS

WO 2013/098597 A1 7/2013

OTHER PUBLICATIONS

EveryNano Counts 'Low Current Measurement C: Feedback Ammeter' Aug. 25, 2011, Website: https://everynanocounts.com/2011/08/25/low-current-measurement-c-feedback-ammeter/ accessed Jan. 21, 2020.*
Li et al. "Performance of a New 235 nm UV-LED-Based On-Capillary Photometric Detector" Anal. Chem. 88(24):12116-12121 (2016) (Abstract Only).

(Continued)

*Primary Examiner* — Eliza W Osenbaugh-Stewart
(74) *Attorney, Agent, or Firm* — Myers Bigel, P. A.

(57) ABSTRACT

Methods for confirming charged-particle generation in an instrument are provided. A method to confirm charged-particle generation in an instrument includes providing electrical connections to a charged-particle optics system of the instrument while the charged-particle optics system is in a chamber. The method includes coupling an electrical component having an impedance to charged-particle current generated in the chamber. Moreover, the method includes measuring an electrical response by the electrical component to the charged-particle current. Related instruments are also provided.

23 Claims, 19 Drawing Sheets

(56) References Cited

U.S. PATENT DOCUMENTS

| | | | |
|---|---|---|---|
| 5,565,680 A * | 10/1996 | Naito | H01J 49/401 |
| | | | 250/290 |
| 5,625,184 A | 4/1997 | Vestal et al. | |
| 5,627,369 A | 5/1997 | Vestal et al. | |
| 5,760,393 A | 6/1998 | Vestal et al. | |
| 5,770,859 A | 6/1998 | Bielawski | |
| 6,614,021 B1 | 9/2003 | Kalinitchenko | |
| 6,770,870 B2 | 8/2004 | Vestal | |
| 7,973,277 B2 | 7/2011 | Rafferty | |
| 8,735,810 B1 | 5/2014 | Vestal | |
| 9,536,726 B2 | 1/2017 | Vangordon et al. | |
| 2006/0017003 A1 * | 1/2006 | Keller | H01J 49/067 |
| | | | 250/396 ML |
| 2011/0121165 A1 | 5/2011 | Watling et al. | |
| 2011/0155901 A1 | 6/2011 | Vestal | |
| 2013/0146778 A1 | 6/2013 | Nuetzel et al. | |
| 2013/0240907 A1 | 9/2013 | Nutzel et al. | |
| 2015/0048245 A1 | 2/2015 | Vestal et al. | |
| 2017/0263426 A1 * | 9/2017 | Hall | H01J 49/0036 |

OTHER PUBLICATIONS

Vestal et al. "High Performance MALDI-TOF mass spectrometry for proteomics" International Journal of Mass Spectrometry 268(12):83-92 (2007).

Vestal et al. "Resolution and Mass Accuracy in Matrix-Assisted Laser Desorption Ionization-Time-of-Flight" Journal of the American Society for Mass Spectrometry 9:892-911 (1998).

Vestal, Marvin L. "Modern MALDI time-of-flight mass spectrometry" Journal of Mass Spectrometry 44:303-317 (2009).

Wiley et al. "Time-of-Flight Mass Spectrometer with Improved Resolution" The Review of Scientific Instruments 26(12):1150-1157 (1955).

Hutsel, Brian T. "Characterization of a piezoelectric transformer plasma source" PhD. Dissertation, University of Missouri (2012).

Baxter, Emily A. "Characterization of ion sources for compact accelerator neutron production" M.S. Thesis, University of Missouri (2011).

International Search Report and the Written Opinion of the International Searching Authority in corresponding PCT Application No. PCT/US19/17445 (11 pages) (dated Apr. 23, 2019).

* cited by examiner

METHODS FOR CONFIRMING CHARGED-PARTICLE GENERATION IN AN INSTRUMENT, AND RELATED INSTRUMENTS

RELATED APPLICATIONS

This application claims the benefit of and priority to U.S. Provisional Application Ser. No. 62/629,854, filed Feb. 13, 2018, the contents of which are hereby incorporated by reference as if recited in full herein.

FIELD

The present invention relates to mass spectrometers and other instruments that generate charged particles.

BACKGROUND

Mass spectrometers are devices that ionize a sample and then determine the mass-to-charge ratios of the collection of ions formed. One well-known mass spectrometer is the Time-Of-Flight Mass Spectrometer (TOFMS), in which the mass-to-charge ratio of an ion is determined by the amount of time required for that ion to be transmitted under the influence of electric fields from the ion source to a detector. The spectral quality in the TOFMS reflects the initial conditions of the ion beam prior to acceleration into a field free drift region. Specifically, any factor that results in ions of the same mass having different kinetic energies and/or being accelerated from different points in space may result in a degradation of spectral resolution and, thereby, a loss of mass accuracy.

Matrix-Assisted Laser Desorption Ionization (MALDI) is a well-known method to produce gas-phase biomolecular ions for mass spectrometric analysis. The development of Delayed Extraction (DE) for MALDI-TOF has made high-resolution analysis routine for MALDI-based instruments. In DE-MALDI, a short delay is added between the ionization event, triggered by the laser, and the application of the accelerating pulse to the TOF source region. The fast (i.e., high-energy) ions will travel farther than the slow ions, thereby transforming the energy distribution upon ionization to a spatial distribution upon acceleration (in the ionization region prior to the extraction pulse application).

See U.S. Pat. Nos. 5,625,184, 5,627,369, 5,760,393, and 9,536,726. See also, Wiley et al., *Time-of-flight mass spectrometer with improved resolution*, Review of Scientific Instruments vol. 26, no. 12, pp. 1150-1157 (2004); M. L. Vestal, *Modern MALDI time-of-flight mass spectrometry*, Journal of Mass Spectrometry, vol. 44, no. 3, pp. 303-317 (2009); Vestal et al., *Resolution and mass accuracy in matrix-assisted laser desorption ionization-time-of-flight*, Journal of the American Society for Mass Spectrometry, vol. 9, no. 9, pp. 892-911 (1998); and Vestal et al., *High Performance MALDI-TOF mass spectrometry for proteomics*, International Journal of Mass Spectrometry, vol. 268, no. 2, pp. 83-92 (2007). The contents of these documents are hereby incorporated by reference as if recited in full herein.

SUMMARY

Embodiments of the present invention are directed to methods for confirming charged-particle generation. A method to confirm charged-particle generation in an instrument may, according to some embodiments, include providing electrical connections to a charged-particle optics system of the instrument while the charged-particle optics system is in a chamber. The method may include coupling an electrical component having an impedance to charged-particle current generated in the chamber. Moreover, the method may include measuring an electrical response by the electrical component to the charged-particle current.

In some embodiments, providing the electrical connections to the charged-particle optics system may include grounding, or applying a voltage to, adjacent ion optics screens or plates of the charged-particle optics system. The electrical component may be a resistor that is external to the chamber, and the impedance may be a resistance value of the resistor between 10 kiloOhms (kΩ) and 100 MegaOhms (MΩ). Moreover, grounding, or applying the voltage to, adjacent ion optics screens or plates of the charged-particle optics system may include grounding an extraction plate of the charged-particle optics system, connecting a first side of the resistor to a back bias plate of the charged-particle optics system while the back bias plate is in the chamber and while the resistor is external to the chamber, connecting a power supply to a second side of the resistor while the power supply is external to the chamber, and applying the voltage via the power supply while the power supply is external to the chamber.

In some embodiments, the resistance value of the resistor may be between 100 kΩ and 100 MΩ. Additionally or alternatively, the method may include disconnecting a cable attached to a component of the charged-particle optics system other than the extraction plate and the back bias plate. Moreover, in some embodiments, the method may include firing a laser of the instrument toward a sample plate that is in the chamber to generate the charged-particle current in the chamber, while the extraction plate is grounded, while the first and second sides of the resistor are connected to the back bias plate and the power supply, respectively, and while the power supply is applying the voltage. Firing the laser may include firing the laser toward a sample on the sample plate, and the method may include firing the laser toward a blank slide that is free of any samples and determining whether a measurable current generated by the firing the laser toward the blank slide passes through the resistor.

In some embodiments, the method may include removing a downstream charged-particle optics component of the charged-particle optics system. Coupling the electrical component to the charged-particle current may be performed while the downstream charged-particle optics component is removed.

In some embodiments, the instrument may include a mass spectrometer, and the method may include determining that no signal is being generated by the mass spectrometer. Moreover, providing the electrical connections to the charged-particle optics system may include providing a first state of the electrical connections that is different from a previous second state of the electrical connections, in response to the determining that no signal is being generated by the mass spectrometer.

In some embodiments, the charged-particle current may be a measured ion current, and the method may include determining a quantity of ions that are generated in the chamber by comparing the measured ion current with a predetermined value. Moreover, the charged-particle current may be a current of an electron beam that is generated in the chamber.

In some embodiments, coupling may include firing a laser of the instrument toward a target that is in the chamber to generate the charged-particle current. The method may include adjusting laser energy and/or laser focus of the laser in response to the measuring the electrical response by the electrical component to the charged-particle current. Additionally or alternatively, providing the electrical connections may be performed while the chamber is under vacuum pressure.

A method to confirm ionization in an instrument may, according to some embodiments, include grounding a first plate or screen of an ion optics system of the instrument while the first plate or screen is in a chamber that is under vacuum pressure. The method may include connecting a first side of an electrical component having an impedance to a second plate or screen of the ion optics system while the second plate or screen is in the chamber. The method may include connecting a power supply to a second side of the electrical component while the power supply is external to the chamber. The method may include applying a voltage via the power supply while the power supply is external to the chamber. The method may include firing a laser of the instrument toward a sample plate of the instrument, while the first plate or screen is grounded, while the first and second sides of the electrical component are connected to the second plate or screen and the power supply, respectively, and while the power supply is applying the voltage. Moreover, the method may include coupling the electrical component to ion current generated from a sample that is on the sample plate while the sample plate is in the chamber.

In some embodiments, the instrument may include a mass spectrometer, the electrical component may be a resistor that is external to the chamber, the impedance may be a resistance value of the resistor between 100 kiloOhms (kΩ) and 100 MegaOhms (MΩ), and the method may include determining that no signal is being generated by the mass spectrometer. Moreover, the first plate or screen may be an extraction plate, the second plate or screen may be a back bias plate, and the grounding and the connecting the first side may be performed in response to the determining that no signal is being generated by the mass spectrometer.

In some embodiments, the method may include measuring a first electrical response by the electrical component to the ion current. The method may include firing the laser toward a blank slide that is free of any sample. Moreover, the method may include measuring a second electrical response, or detecting an absence thereof, by the electrical component to the firing the laser toward the blank slide. Additionally or alternatively, the method may include determining a quantity of ions that are generated by comparing the ion current with a predetermined value.

An instrument, according to some embodiments, may include a chamber that includes an ion optics system including a first plate or screen and a second plate or screen. The chamber may also include a sample plate. The instrument may include a power supply that is external to the chamber and an electrical component that is connectable between the second plate or screen and the power supply. The electrical component may have an impedance and may be configured to receive charged-particle current generated in the chamber.

In some embodiments, the instrument may include a mass spectrometer, the electrical component may be a resistor that is external to the chamber, and the impedance may be a resistance value of the resistor between 10 kiloOhms (kΩ) and 100 MegaOhms (MΩ). Additionally or alternatively, a deflector portion of the ion optics system may be removable from the ion optics system.

In some embodiments, the instrument may include a laser configured to fire toward the sample plate, while first and second sides of the resistor are connected to the second plate or screen and the power supply, respectively, and while the power supply is applying a voltage. The resistor may be configured to receive ion current generated from a sample that is on the sample plate. The resistance value of the resistor may be a predetermined value between 100 kΩ and 100 MΩ. Moreover, the first plate or screen may be an extraction plate and the second plate or screen may be a back bias plate.

In some embodiments, the instrument may include a shorting plug by which the extraction plate is connectable to ground. The laser may be configured to fire toward the sample plate while the extraction plate is grounded. Additionally or alternatively, the instrument may include a switch by which the extraction plate is switchably connectable to ground. The switch may be external to the chamber, and the laser may be configured to fire toward the sample plate while the extraction plate is grounded. Moreover, the instrument may include a switch, which is external to the chamber, and by which the resistor is switchably connectable between the back bias plate and the power supply.

Further features, advantages, and details of the present invention will be appreciated by those of ordinary skill in the art from a reading of the figures and the detailed description of the example embodiments that follow, such description being merely illustrative of the present invention.

It is noted that aspects of the invention described with respect to one embodiment may be incorporated in a different embodiment although not specifically described relative thereto. That is, all embodiments and/or features of any embodiment can be combined in any way and/or combination. Applicant reserves the right to change any originally-filed claim or file any new claim accordingly, including the right to be able to amend any originally-filed claim to depend from and/or incorporate any feature of any other claim although not originally claimed in that manner. These and other objects and/or aspects of the present invention are explained in detail in the specification set forth below.

DETAILED DESCRIPTION

The present invention now will be described more fully hereinafter with reference to the accompanying drawings, in which illustrative embodiments of the invention are shown. Like numbers refer to like elements and different embodiments of like elements can be designated using a different number of superscript indicator apostrophes (e.g., 10, 10', 10", 10''').

During assembly of a mass spectrometry instrument/system, it may be advantageous to have a diagnostic to confirm the occurrence of ionization due to, for example, a MALDI process. According to embodiments of the present invention, such a diagnostic may be provided by using the existing ion optics of the instrument/system as a charge collection plate. Moreover, an external Direct Current (DC) power supply may be used to bias one of the plates of the ion optics.

Figure 1A:
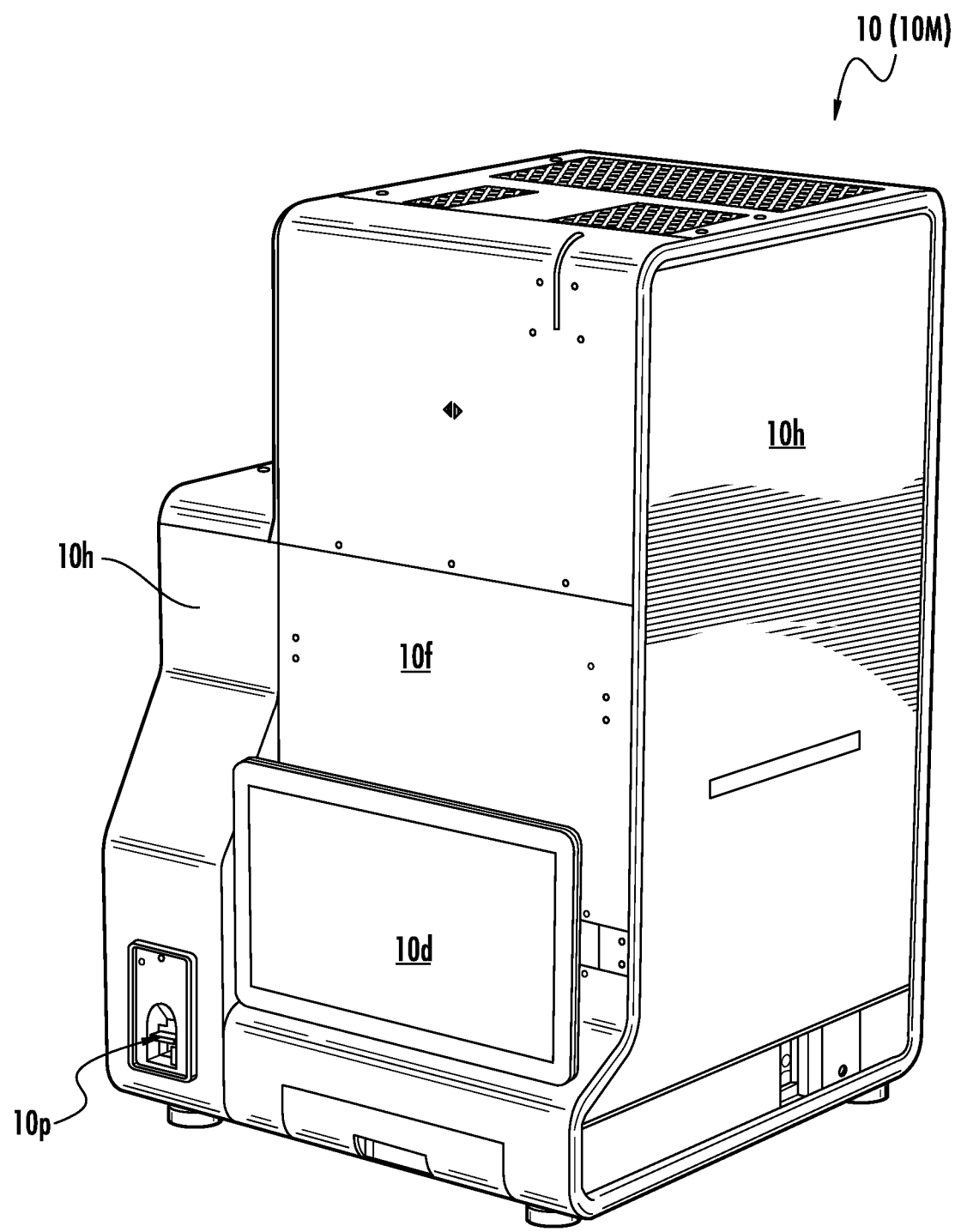
FIG. 1A is a perspective view of an instrument, according to embodiments of the present invention.
Figure 1B:
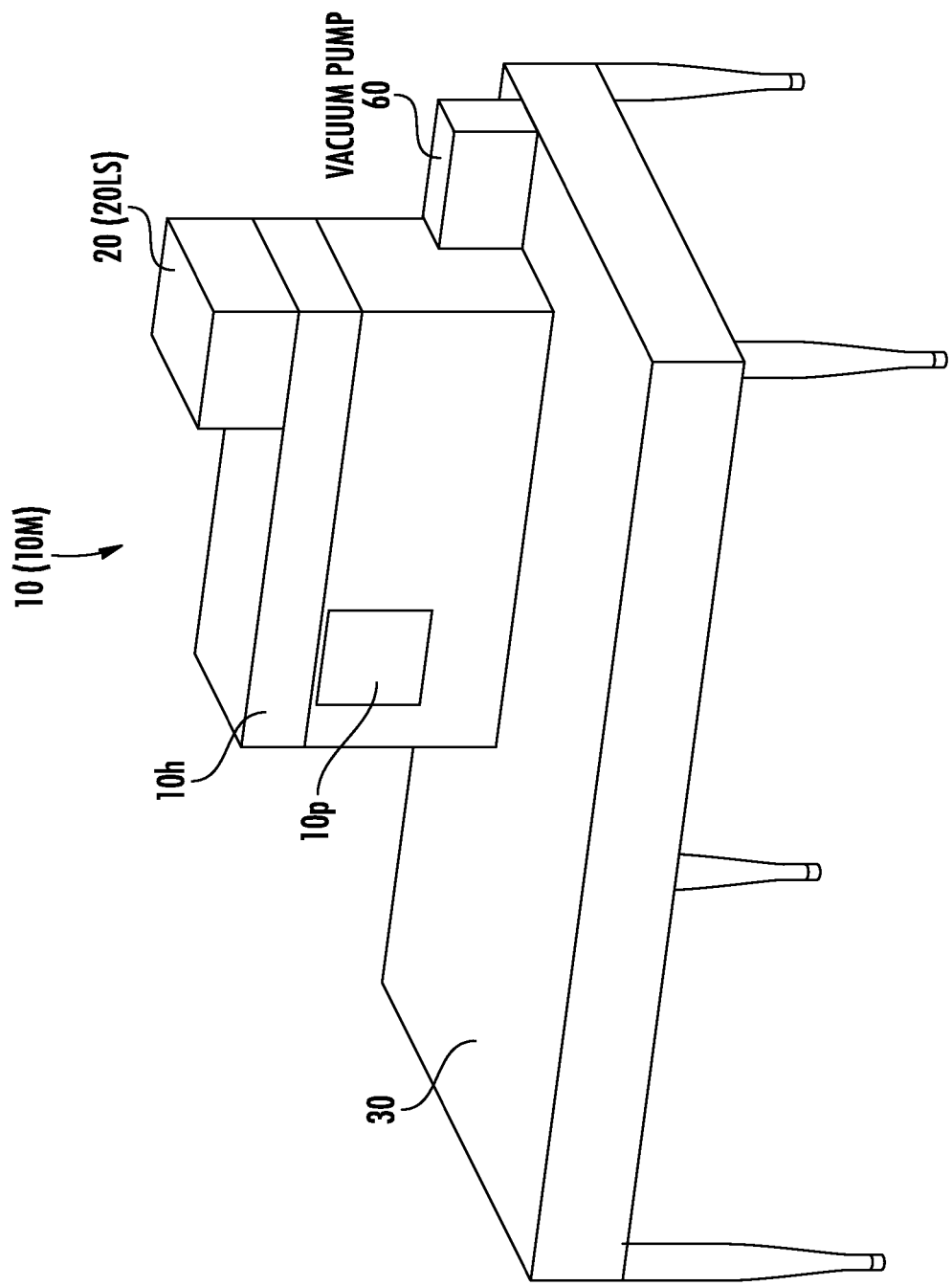
FIG. 1B is a perspective view of an instrument and a light source, according to embodiments of the present invention.

FIG. 1A and FIG. 1B illustrate an example instrument 10, such as a mass spectrometer 10M. As shown in FIG. 1A, the instrument 10 includes a housing 10h with a front wall 10f having a display 10d with a user interface. The housing 10h also has at least one sample specimen entry port 10p that can be sized and configured to receive slides. One or more ports 10p may be used. Each port 10p can be configured as entry-only, exit-only, or as both an entry- and exit-port for specimen slides (e.g., for a sample plate 230 of FIG. 2A) for analysis.

As shown in FIG. 1B, an instrument 10 may use at least one light source 20, according to embodiments of the present invention. In some embodiments, the instrument 10 may be a mass spectrometer 10M, and the housing 10h may include at least one sample specimen entry port 10p configured to receive slides for the mass spectrometer 10M. For example, the mass spectrometer 10M may be a table top mass spectrometer, as shown by the table 30. Moreover, one or more portions of the instrument 10 may be pumped/evacuated via a vacuum pump 60 to a desired pressure. The vacuum pump 60 and/or the light source 20 may be on board (e.g., inside) the housing 10h or may be provided as an external plug-in component to the instrument 10.

The at least one light source 20 can provide light to generate ions inside the instrument 10. For example, the light source 20 may comprise a laser 20LS that supplies laser light to the instrument 10. As an example, the laser 20LS may be a solid state laser, such as an UltraViolet (UV) laser with a wavelength above 320 nanometers (nm). In some embodiments, the solid state laser 20LS can generate a laser beam with a wavelength between about 347 nm and about 360 nm. The solid state laser 20LS can alternatively be an infrared laser or a visible light laser.

Moreover, although the terms "light source" and "laser" are used to discuss examples herein, the light source 20 may comprise any type of source that generates charged particles inside the instrument 10 by supplying light/energy to a target/device inside the instrument 10. For example, the light source 20 may be configured to provide one of various types of pulses of light/energy to a sample plate 230 (FIG. 2A) in the instrument 10 to generate a pulse of charged particles. In some embodiments, the light source 20 and the sample plate 230 may collectively (or even individually) be referred to as an "ion source," as light from the light source 20 may be directed to the sample plate 230 to generate ions.

Figure 2A:
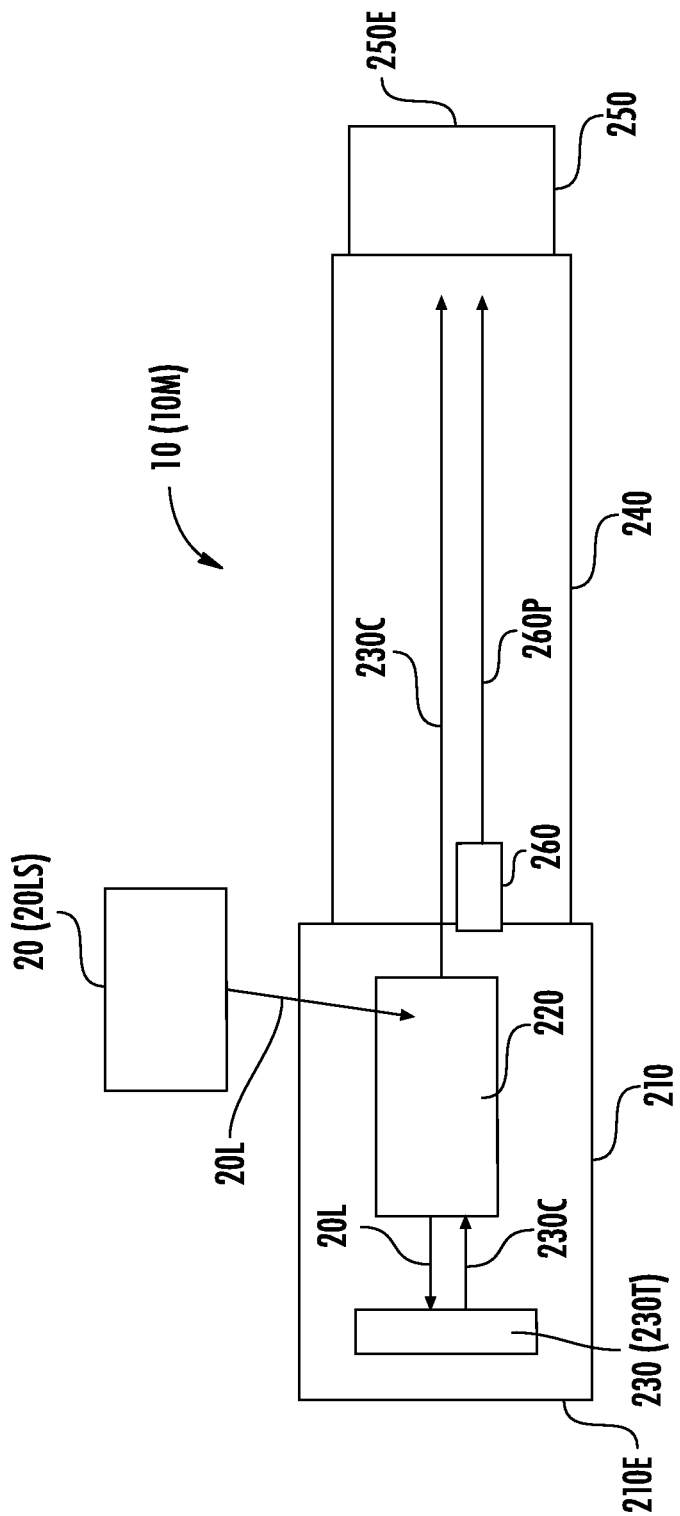
FIG. 2A illustrates a schematic diagram of an instrument and a light source, according to embodiments of the present invention.

FIG. 2A illustrates a schematic diagram of an instrument 10 and a light source 20. The instrument 10 includes a chamber 210, which may be an "acquisition chamber," a "process chamber," a "vacuum chamber," a "chamber under vacuum," or a "chamber in vacuum." Inside the chamber 210 are a sample plate 230 (or other target 230T) and an ion optics system 220, which may also be referred to herein as "ion optics" or an "ion optics assembly."

The ion optics system 220 may be configured to receive light/energy 20L from the light source 20, and to direct the light/energy 20L to the sample plate 230. The light/energy 20L can cause the sample plate 230 to generate an ion current 230C, which passes through the ion optics system 220, through a flight tube 240, and onto a detector 250. The ion current 230C may be measured as part of a diagnostic method/mode to confirm ionization in the instrument 10. Accordingly, as used herein, the term "diagnostic" refers to a diagnostic with respect to the instrument 10 rather than with respect to a patient.

In addition to the ion current 230C, the instrument 10 may, in some embodiments, provide photons 260P from a photon source 260 onto the detector 250. As illustrated in FIG. 2A, the sample plate 230 may be adjacent a first end 210E of the acquisition chamber 210. The first end 210E of the acquisition chamber 210 and a second end 250E of the detector 250 may be on opposite ends/portions of the instrument 10.

Figure 2B:
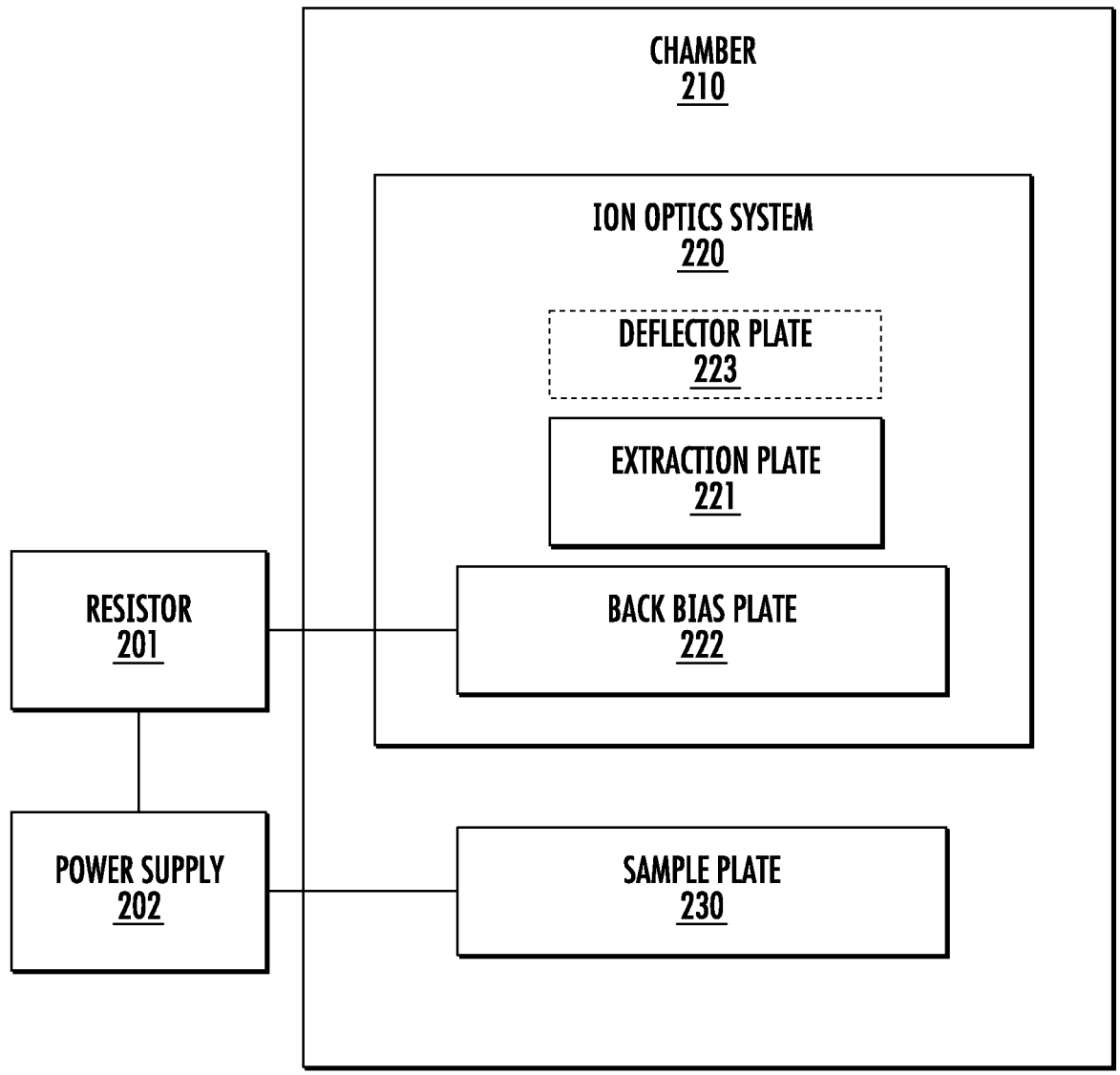
FIG. 2B illustrates a block diagram of the chamber of FIG. 2A, according to embodiments of the present invention.

FIG. 2B illustrates a block diagram of the chamber 210 of FIG. 2A. The ion optics system 220 inside the chamber 210 may include an extraction plate 221 and a back bias plate 222. Moreover, the ion optics system 220 may include a deflector plate 223. In some embodiments, the deflector plate 223 may be omitted or removable from the ion optics system 220.

External to the chamber 210 are a resistor 201 and a power supply 202. The resistor 201 is connectable between (e.g., switchably coupled to) the back bias plate 222 and the power supply 202. As an example, first and second sides/ends of the resistor 201 may be connected to the back bias plate 222 and the power supply 202, respectively. A resistance value of the resistor 201 may be between 10 kiloOhms (kΩ) and 100 MegaOhms (MΩ), such that the resistor 201 is configured to receive ion current 230C generated from a sample on the sample plate 230. Accordingly, the measured current that is described herein is the ion current 230C that passes through the resistor 201. For example, the ion current 230C may be measured by measuring a voltage response across the resistor 201 when the ion current 230C passes through the resistor 201, as ion generation inside the chamber 210 results in a change in voltage and current across the resistor 201. Moreover, the power supply 202 may be connectable between the sample plate 230 and the resistor 201.

Although some examples herein describe a sample on a sample plate 230, the light 20L could, in some embodiments, be directed to a test plate or other target 230T instead of the sample plate 230. Additionally or alternatively, the combination/coupling of the resistor 201, the power supply 202, and the ion optics system 220 may, in some embodiments, be referred to as a "system," such as a diagnostic system. Moreover, as the resistor 201 is outside of the vacuum chamber 210, the resistor 201 is typically at atmospheric pressure. In some embodiments, however, the resistor 201 may be inside the vacuum chamber 210. Additionally or alternatively, any electrical component (e.g., an inductor or a capacitor) having an impedance can be used in place of the resistor 201, as the resistor 201 is merely one example of an electrical component having an impedance.

Figure 2C:
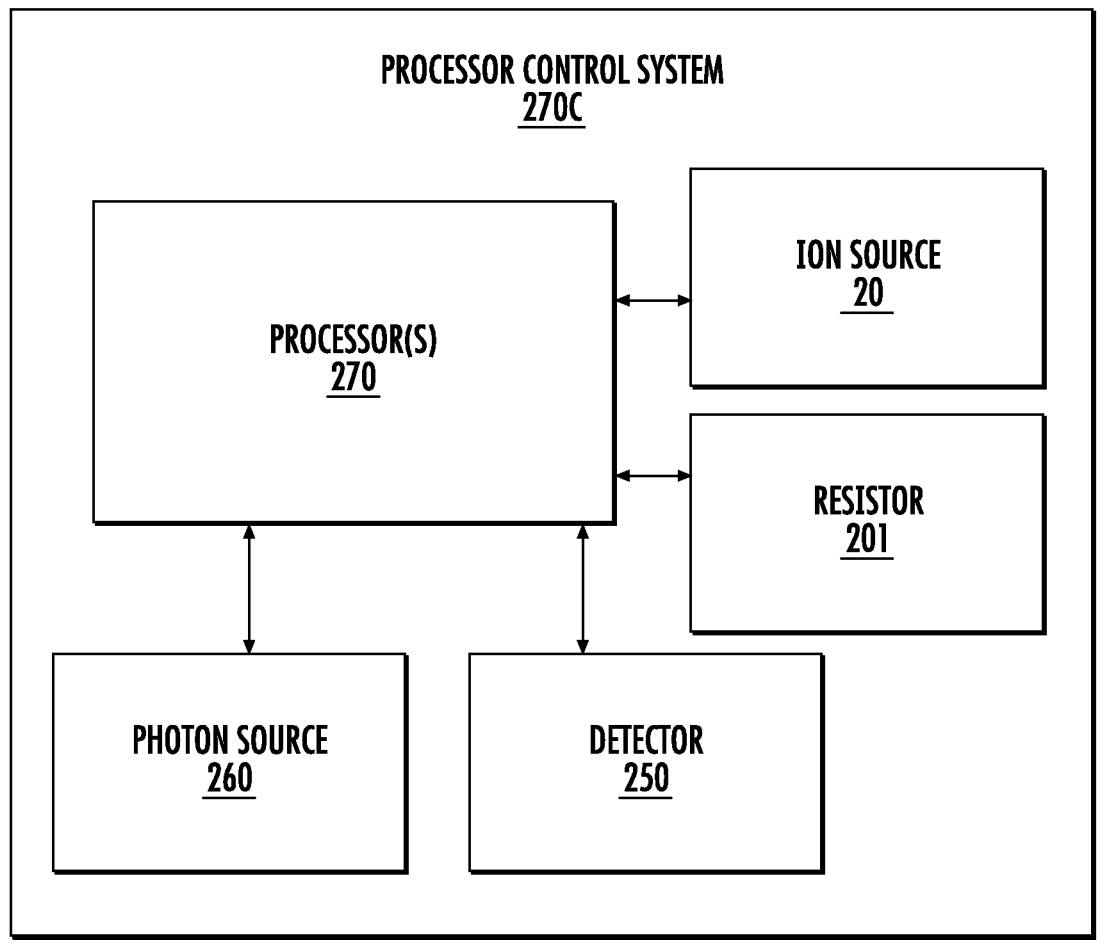
FIG. 2C illustrates a block diagram of a processor control system of the instrument of FIG. 2A, according to embodiments of the present invention.

FIG. 2C illustrates a block diagram of a processor control system 270C. The processor control system 270C may include one or more processors 270, which may be configured to communicate with the light source 20, the resistor 201, the detector 250, and/or the photon source 260. For example, operations of the light source 20 and/or the photon source 260 may be performed under the control of the processor(s) 270. Also, a signal from the resistor 201 (e.g., a signal provided via probes coupled to the resistor 201) may be processed by the processor(s) 270 to measure the ion current 230C that passes through the resistor 201. Moreover, data generated by the detector 250 in response to receiving ions and/or photons 260C may be provided to the processor(s) 270 for processing. The processor(s) 270 may be internal and/or external to the instrument 10.

Figure 2D:
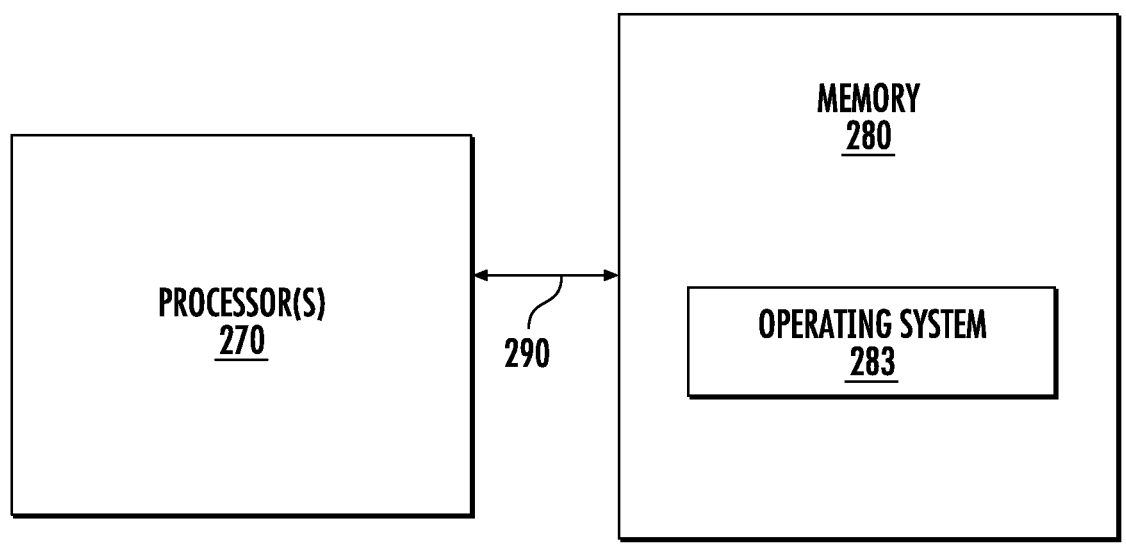
FIG. 2D illustrates a block diagram of an example processor and memory that may be used in accordance with embodiments of the present invention.

FIG. 2D illustrates a block diagram of an example processor 270 and memory 280 that may be used in accordance with various embodiments of the invention. The processor 270 communicates with the memory 280 via an address/data bus 290. The processor 270 may be, for example, a commercially available or custom microprocessor. Moreover, the processor 270 may include multiple processors. The memory 280 is representative of the overall hierarchy of memory devices containing the software and data used to implement various functions as described herein. The memory 280 may include, but is not limited to, the following types of devices: cache, ROM, PROM, EPROM, EEPROM, flash, Static RAM (SRAM), and Dynamic RAM (DRAM).

As shown in FIG. 2D, the memory 280 may hold various categories of software and data, such as an operating system 283. The operating system 283 can control operations of the instrument 10. In particular, the operating system 283 may manage the resources of the instrument 10 and may coordinate execution of various programs by the processor 270.

Figure 3A:
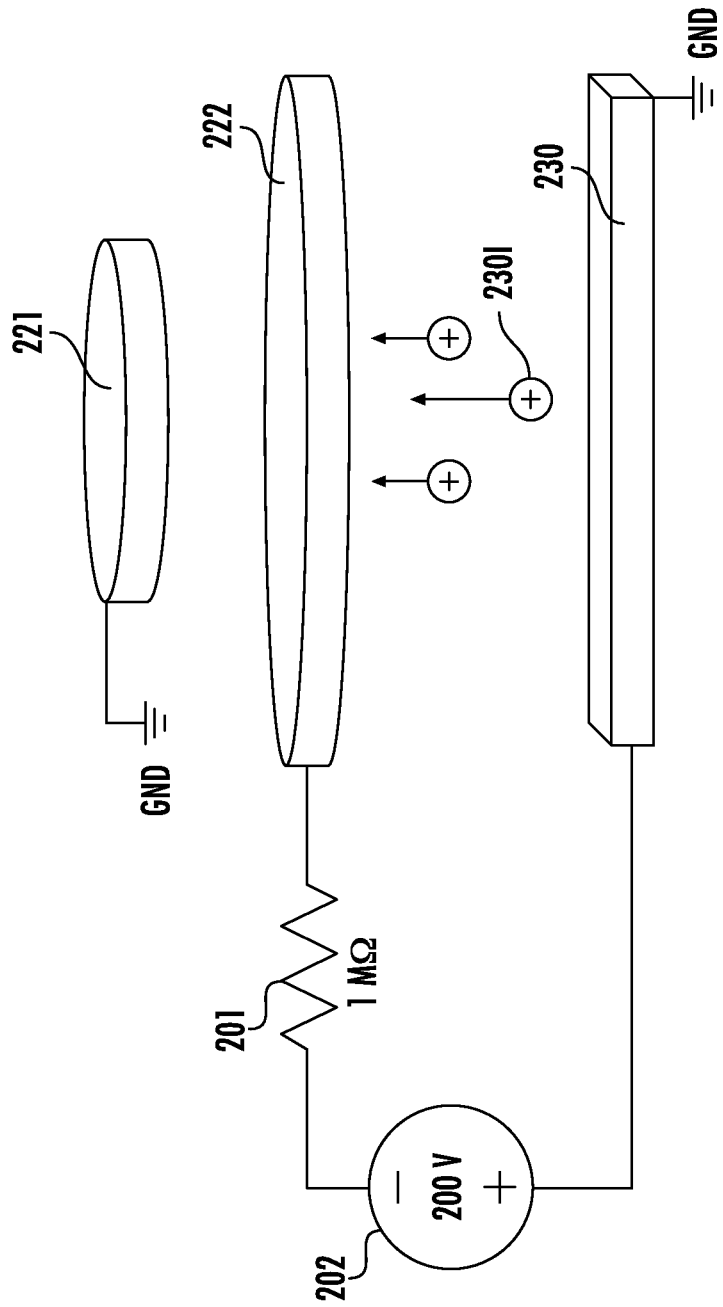
FIGS. 3A-3E illustrate schematic diagrams of an external resistor coupled to an ion optics system of the chamber of FIGS. 2A and 2B, according to embodiments of the present invention.

FIGS. 3A-3E illustrate schematic diagrams of the resistor 201 coupled to the ion optics system 220 of FIGS. 2A and 2B. Referring to FIG. 3A, a first side of the resistor 201 is connected to the back bias plate 222 of the ion optics system 220 and a second side of the resistor 201 is connected to the power supply 202. As discussed with respect to FIG. 2B, the back bias plate 222 is inside the chamber 210, whereas the resistor 201 and the power supply 202 are external to the chamber 210. The sample plate 230, which is also inside the chamber 210, generates ions 230I that flow toward the back bias plate 222. This flow of the ions 230I may be referred to herein as the ion current 230C.

The extraction plate 221 of the ion optics system 220 may be connected to ground (i.e., ground potential) GND. In particular, FIG. 3A illustrates ion behavior when the extraction plate 221 is connected to ground GND. A reversal in electric field direction may cause ion deceleration to a velocity near zero rather than providing a velocity in an opposite/reverse direction. If the extraction plate 221 is instead connected to power, then it can provide ion travel to the back bias plate 222, which may also be referred to herein as a "charge collection plate."

The sample plate 230 may be simultaneously connected to ground GND and to the power supply 202, which may be configured to supply a voltage under about 1000 Volts (V). For example, the power supply 202 may be configured to supply a voltage of about 200 V. Any voltage between about 30 V and about 1000 V, however, may be supplied. The sample plate 230 may be at a single voltage at a given time due to a conductive coating on the surface of the sample plate 230. The significance of the ground GND (0 V) is to reference the voltage with respect to the other end of voltage source 202.

Figure 3B:
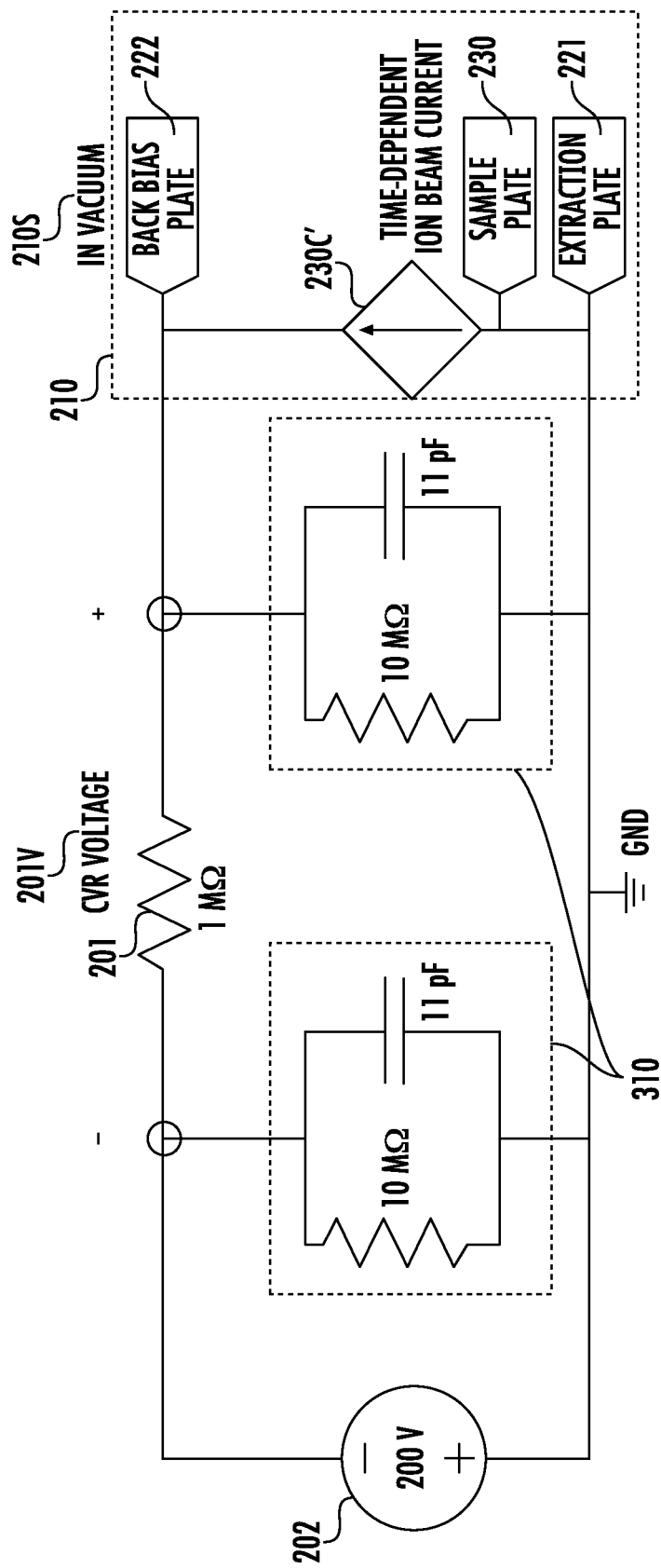

Referring to FIG. 3B, the resistor 201 may serve as a Current-Viewing Resistor (CVR). Based on Ohm's law, the voltage 201V across the resistor 201 is dependent on the magnitude of the current. As only a small current is generated during a single ionization event, the resistance value of the resistor 201 should be large enough to facilitate measuring the voltage 201V response. The resistance value, however, should be small enough that the measured voltage 201V will not damage test equipment, including the power supply 202 that is used to bias the back bias plate 222. As such, resistance values between about 10 kΩ and about 100 MΩ would be appropriate for the resistor 201. For example, the resistor 201 may have a resistance value of about 1 MΩ. In some embodiments, the resistance value may be between about 100 kΩ and about 100 MΩ. Moreover, even lower resistance values than 100 kΩ may be used given sufficient signal filtering, processing, and amplification of the measured CVR voltage 201V. Accordingly, a resistance value as low as about 10 kΩ may be used in some embodiments. The resistance value may be a known/predetermined value.

FIG. 3B also illustrates probes 310 that can be used to measure the CVR voltage 201V across the resistor 201. Each probe 310 may have a resistance and a capacitance. For example, each probe 310 may have a 10 MΩ resistance and an 11 picofarad (pF) capacitance.

Furthermore, the ion current 230C provided from the sample plate 230 to the back bias plate 222 may be a time-dependent ion beam current 230C'. Also, FIG. 3B shows that the pressure state 210S of the chamber 210 may be in vacuum when the time-dependent ion beam current 230C' is generated and the CVR voltage 201V is measured. It may be advantageous to perform the current/voltage measurement(s) described herein without venting the chamber 210, as venting the chamber 210 may result in multiple hours of pumping time to return to vacuum pressures after venting. A further (and potentially more important) reason for operating in vacuum is that the ions 230I may not reach the charge collection plate due to the decreased mean free path of the ions 230I at higher pressures. Moreover, in some embodiments, the current/voltage measurement(s) can be performed using plates or other hardware separate from the ion optics system 220. Although the current/voltage measurement(s) may be used for instrument diagnostics, the current/voltage measurement(s) may additionally or alternatively be used for calibration purposes, such as for laser energy adjustment or focus.

Figure 3C:
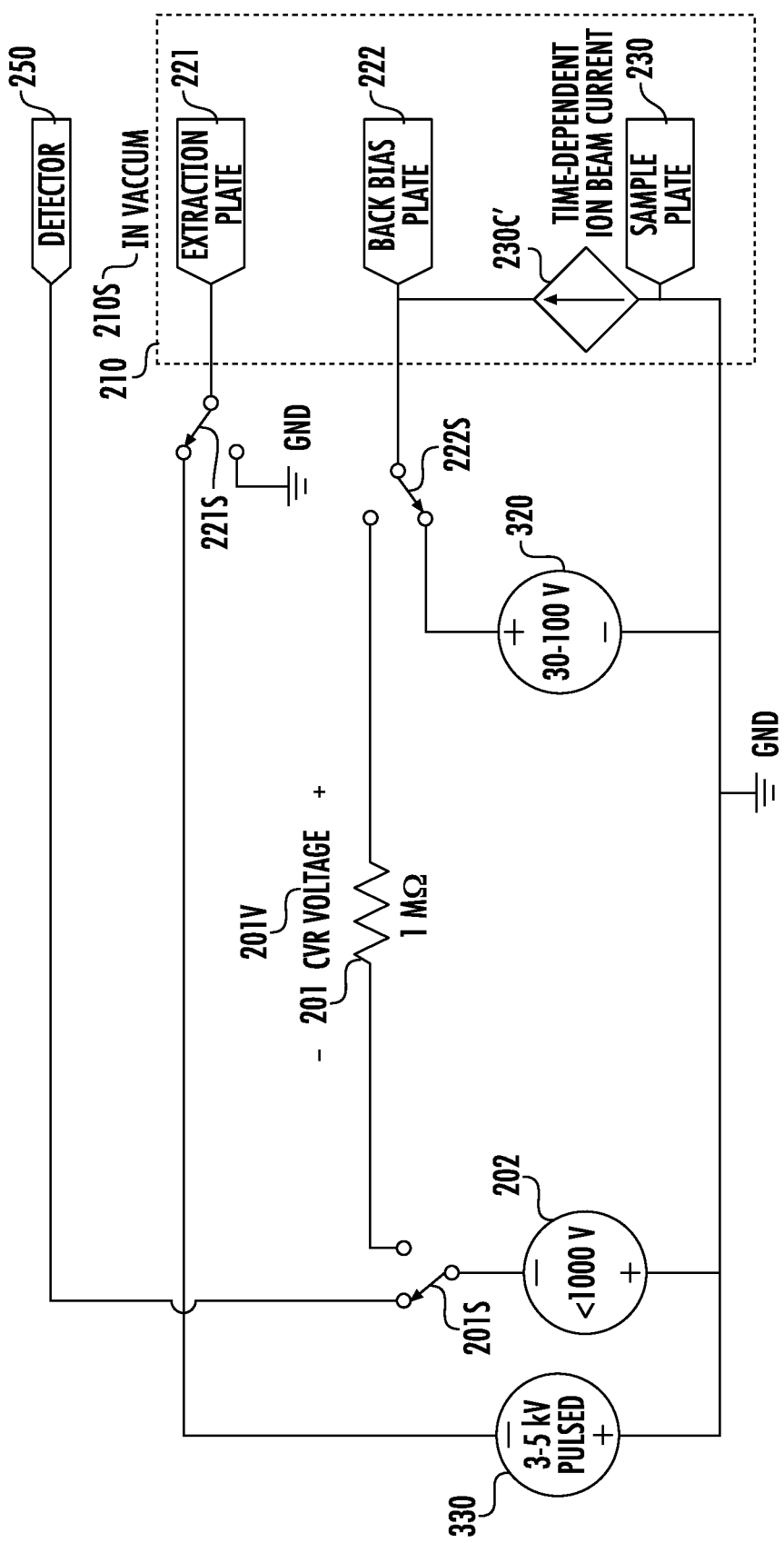

Referring to FIG. 3C, example electrical connections external to the chamber 210 are illustrated. Because the connections are external to the chamber 210, it is possible to provide the diagnostic mode(s)/method(s) described herein for the instrument 10 without significant hardware additions. For example, switches 221S and 222S are shown outside of the chamber 210. The switches 221S and 222S may be relays or other switches, and may be used to connect plates inside the chamber 210 to power supplies or to ground GND outside of the chamber 210. As an example, FIG. 3C illustrates that the switch 221S selects whether (e.g., selectively connects) the extraction plate 221 is connected to ground GND or to a pulsed power supply 330, which may be a 3-5 kiloVolt (kV) pulsed power supply. Moreover, the switch 222S selects whether the back bias plate 222 is connected to the resistor 201 or to a third power supply 320, which may be a 30-100 V power supply. Accordingly, the extraction plate 221 and the back bias plate 222 inside the chamber 210 may be referred to herein as being "switchably connectable" to power supplies or to ground GND outside of the chamber 210 via the switches 221S and 222S, respectively.

FIG. 3C further illustrates a switch 201S that selects whether to connect the resistor 201 to the power supply 202. When disconnected from the resistor 201, the power supply 202 may instead be connected to the detector 250. For example, when the instrument 10 is operating in a standard mode (e.g., a sample analysis mode) rather than a diagnostic mode, the switches 201S and 222S may disconnect respective ends of the resistor 201 from the power supply 202 and the back bias plate 222. Accordingly, the resistor 201 may be referred to herein as being "switchably connectable" between the back bias plate 222 and the power supply 202 by the switch 222S and/or the switch 201S.

The CVR voltage 201V may be measured when the switch 201S and/or the switch 222S connect(s) the resistor 201 between the back bias plate 222 and the power supply 202. For example, the CVR voltage 201V may be measured via an external oscilloscope (e.g., using the probes 310 of FIG. 3B) or may be diverted to an internal digitizer within the instrument 10 (e.g., a digitizer within a mass spectrometer 10M). Moreover, operations of the switches 201S, 221S, and 222S may be controlled by the one or more processors 270 of FIGS. 2C and 2D.

Figure 3D:
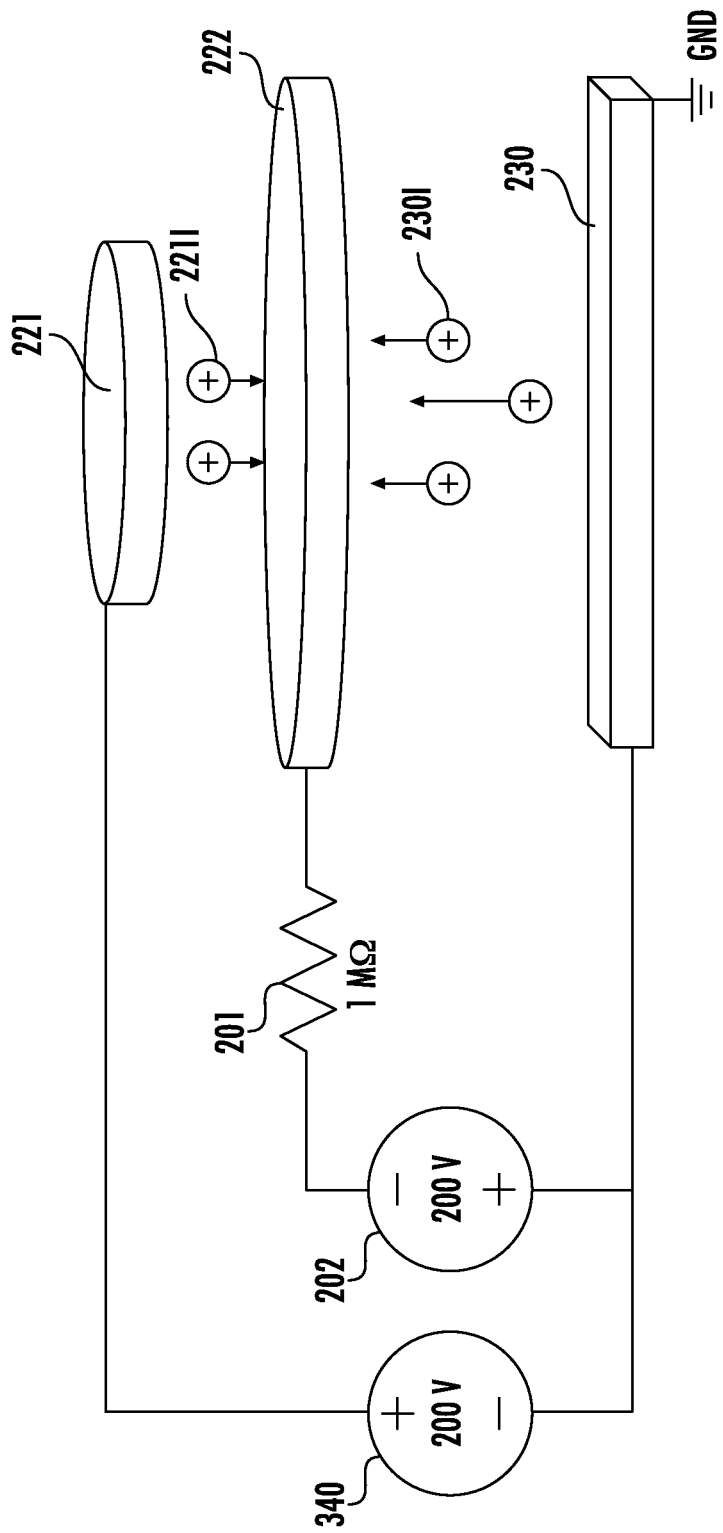

Referring to FIG. 3D, the extraction plate 221 may be connected to a power supply 340 instead of being connected to ground GND as shown in FIGS. 3A and 3B. The power supply 340 is configured to apply a voltage to the extraction plate 221 to transmit ions 221I from the extraction plate 221 to the back bias plate 222. The ions 221I may be ones of ions 230I that arrived at the extraction plate 221 by passing from the sample plate 230 through an aperture in the back bias plate 222. Accordingly, the voltage applied by the power supply 340 may return the ions 221I to the back bias plate 222. In some embodiments, the voltage supplied by the power supply 340 may be equal in magnitude and opposite in polarity to the voltage supplied by the power supply 202 to the back bias plate 222. This may allow for a small increase in current that is collected on the back bias plate 222, thus making the voltage response across the resistor 201 easier to detect.

For example, as discussed herein with respect to FIG. 3C, the CVR voltage 201V across the resistor 201 may be measured via an external oscilloscope or may be diverted to an internal digitizer within the instrument 10. The power supply 340 and the resistor 201 are external to the chamber 210 that includes the extraction plate 221. Accordingly, the measurement of the CVR voltage 201V while the power supply 340 is applying a voltage to the extraction plate 221 may, in some embodiments, be performed via hardware external to the chamber 210 with switchable and/or manual/releasable connections to the inside of the chamber 210.

Figure 3E:
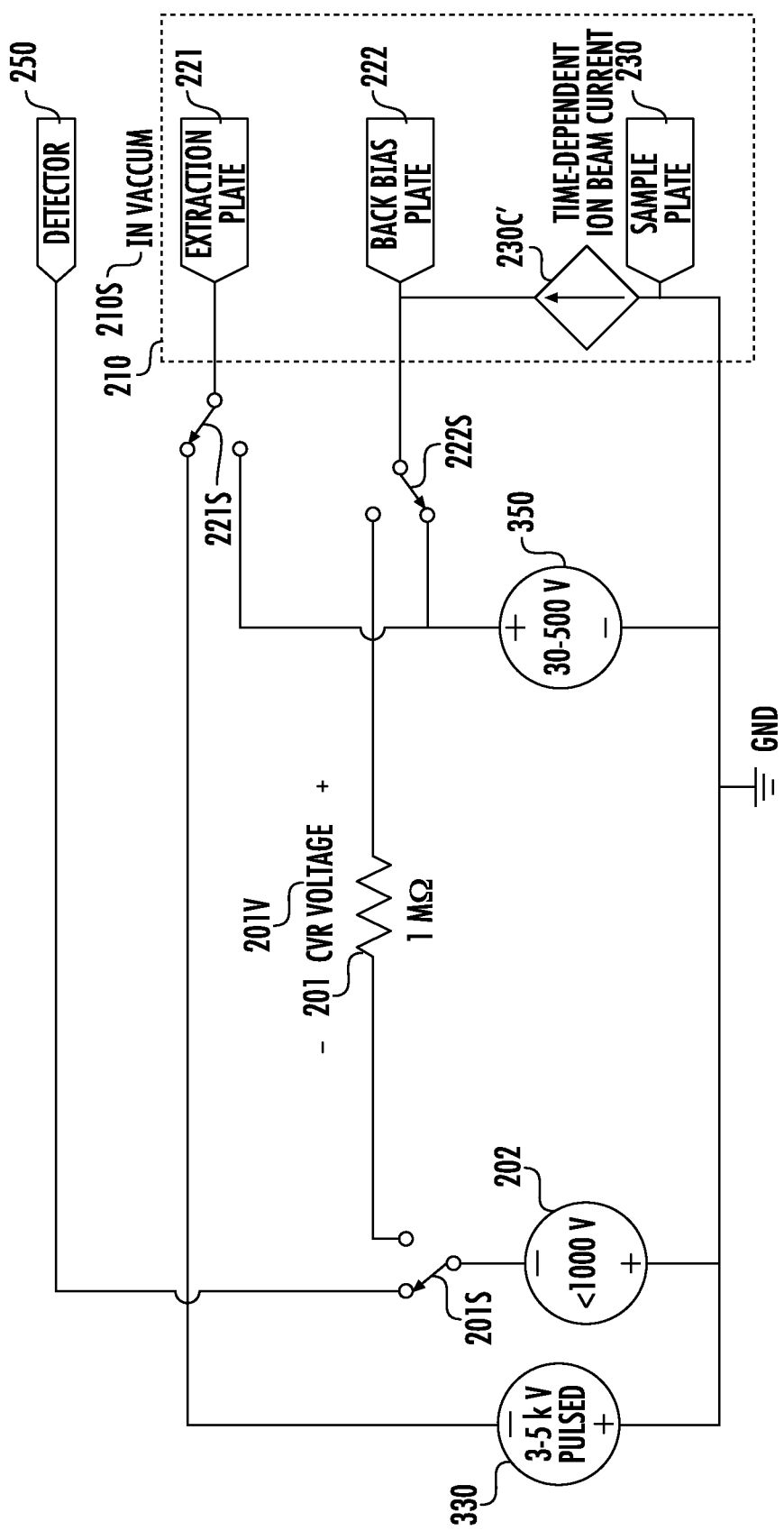

Referring to FIG. 3E, a power supply 350 may be connected to the extraction plate 221 to transmit the ions 221I of FIG. 3D to the back bias plate 222. In some embodiments, the power supply 350 may supply voltages ranging from about 30 V to about 500 V. Moreover, in some embodiments, the extraction plate 221 and the back bias plate 222 may be switchably connectable to the power supply 350. For example, the switches 221S and 222S may select whether to connect the extraction plate 221 and the back bias plate 222, respectively, to the power supply 350. When the instrument 10 is analyzing a sample, the extraction plate 221 may be connected to the pulsed power supply 330, and the back bias plate 222 may be connected to the power supply 350. On the other hand, when the instrument 10 is performing a diagnostic method, the extraction plate 221 may be connected to the power supply 350, and the back bias plate 222 may be connected to the resistor 201.

In some embodiments, the measured ion current 230C may be compared with a predetermined threshold ion current value. For example, if the instrument 10 has a predetermined threshold ion current value that is suitable for mass spectra generation, the response of the diagnostic method(s) described herein may be used to confirm/set ionization. As an example, for MALDI ionization, the laser pulse energy may be fixed and the laser spot size varied, or vice versa, until the predetermined threshold ion current value is detected via the resistor 201.

The method(s) described herein may be used for mass spectrometers. Any system/instrument using charged-particle optics for the acceleration of ion beams or electron beams, however, may use the method(s). Such systems/instruments may include electron microscopes, plasma thrusters, X-ray generators, ion beams for medical treatment, and ion implanters for semiconductor manufacturing, among others. Accordingly, the term "charged-particle optics system," as used herein, is not limited to an optics system for ions. Similarly, the instrument 10 described herein may measure "charged-particle current," which is not limited to measuring ion current. Also, the measurement(s) may be performed to confirm "charged-particle generation," which is not limited to confirming ionization. Moreover, for electron-beam applications, the polarities of the voltages described herein with respect to ion applications would be reversed.

FIGS. 4A-4E illustrate flowcharts of methods to confirm ionization, or other charged-particle generation, in the instrument 10. In some embodiments, the memory 280 of FIG. 2D may be a non-transitory computer readable storage medium including computer readable program code therein that when executed by the processor 270 causes the processor 270 to perform the method(s) of any of FIGS. 4A-4E.

Figure 4A:
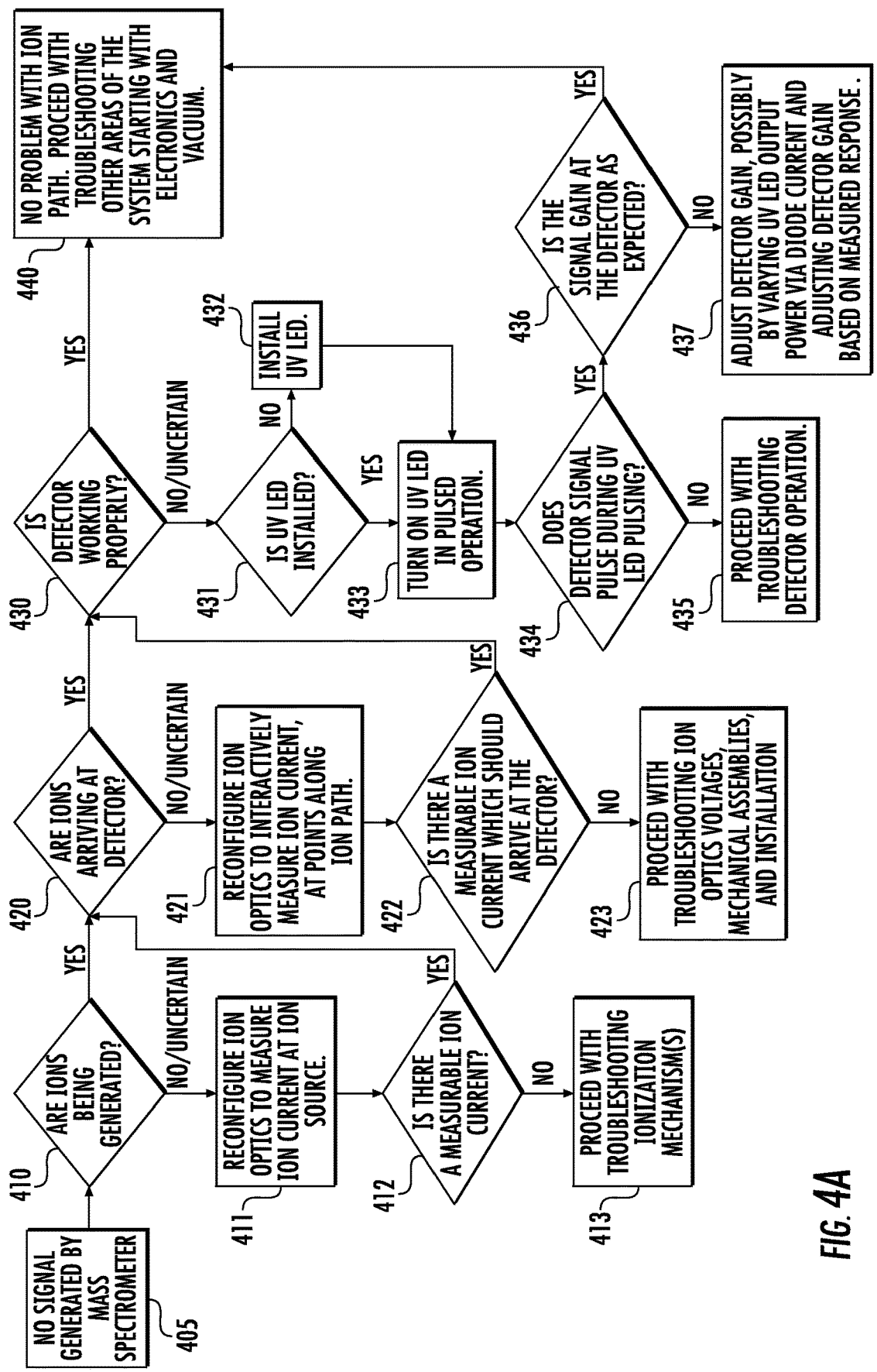
FIGS. 4A-4E illustrate flowcharts of example methods to confirm ionization or other charged-particle generation in an instrument, according to embodiments of the present invention.

Referring to FIG. 4A, the methods may include providing/reconfiguring (Block 411) the ion optics system 220 so that the ion current 230C inside the chamber 210 of the instrument 10 can be measured (e.g., measured via the resistor 201 external to the vacuum chamber 210). The method shown in FIG. 4A may then include determining (Block 412) whether the ion current 230C is measurable. Accordingly, ionization in the instrument 10 may be confirmed based on the operations of Blocks 411 and 412.

Moreover, if the ion current 230C is measurable (Block 412), then the method may include determining (Block 420)

whether the ions 230I are arriving at the detector 250. On the other hand, if the ion current 230C is not measurable (Block 412), then troubleshooting (Block 413) of ionization mechanism(s) should be performed.

If the ions 230I are arriving at the detector 250 (Block 420), then the method may include determining (Block 430) whether the detector 250 is operating properly. On the other hand, if the ions 230I are not arriving at the detector 250 or if their arrival is uncertain (Block 420), then the ion optics system 220 may be provided/reconfigured (Block 421) to iteratively measure the ion current 230C at points along a path of the ions 230I.

The method may then including determining (Block 422) whether it detects a measurable ion current 230C that should arrive at the detector 250. If so, then the method may include determining (Block 430) whether the detector 250 is operating properly. On the other hand, if the method does not detect a measurable ion current 230C that should arrive at the detector 250 (Block 422), then troubleshooting (Block 423) of voltages, mechanical assemblies, and/or installation of the ion optics system 220 should be performed.

If the detector 250 is operating properly (Block 430), then it may be determined (Block 440) that the path of the ions 230I is suitable. Moreover, in some embodiments, troubleshooting of other areas of the system/instrument 10 may be performed, including electronics troubleshooting and/or vacuum troubleshooting. If, on the other hand, the detector 250 is not working properly or the propriety of operation is uncertain (Block 430), then the method may include turning on (Block 433) a UV Light Emitting Diode (LED) in a pulsed operation. Before turning on (Block 433) the UV LED, the method may include determining (Block 431) whether the UV LED is installed. If not, then the UV LED may be installed (Block 432). In some embodiments, the UV LED may be the photon source 260 of FIG. 2A.

After turning on (Block 433) the UV LED, the method may include determining (Block 434) whether the detector 250 signal pulses during pulsing of the UV LED. If so, then the method may include determining (Block 436) whether the signal gain of the detector 250 is as expected, such as by comparing the signal gain with a threshold signal gain value. On the other hand, if the detector 250 does not signal pulse (Block 434) during pulsing of the UV LED, then troubleshooting (Block 435) of the detector 250 may be performed.

If the signal gain of the detector 250 is not as expected (Block 436), such as by being below a threshold signal gain value, then the method may include adjusting (Block 437) the gain of the detector 250. For example, the method may include varying the output power of the UV LED (e.g., by varying the diode current) and then adjust the gain of the detector 250 based on the measured response. If, on the other hand, the signal gain of the detector 250 is as expected (Block 436), then operations may proceed to Block 440, which is described above herein.

Referring again to Block 411, the providing/reconfiguring of the ion optics system 220 may be performed in response to determining (Block 410) that the ions 230I are not being generated, or that their generation is uncertain. If, on the other hand, it is determined that the ions 230I are being generated (Block 410), then the method may proceed directly to determining (Block 420) whether the ions 230I are arriving at the detector 250, and the operations of Blocks 411 and 412 may be omitted. Moreover, in some embodiments, the instrument 10 may be a mass spectrometer 10M, and the operation(s) of Blocks 410, 411, and/or 412 may be performed in response to determining (Block 405) that no signal is being generated by the mass spectrometer 10M.

Figure 4B:
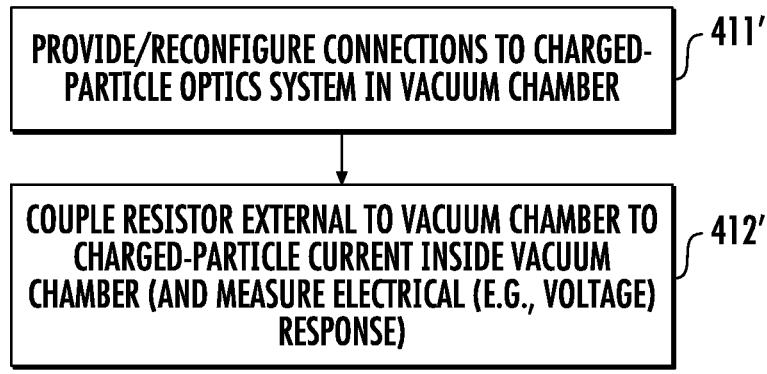

Referring to FIG. 4B, the method(s) described herein are not limited to ionization. For example, the operations of Blocks 411 and 412 of FIG. 4A may be performed with respect to various types of charged particles, as indicated by Blocks 411' and 412' of FIG. 4B, respectively. In particular, FIG. 4B illustrates a method that includes providing/reconfiguring (Block 411') electrical connections to a charged-particle optics system 220 of the instrument 10 while the charged-particle optics system 220 is in a vacuum chamber 210 that is in/under vacuum pressure. In some embodiments, the providing/reconfiguring operation(s) of Block 411' may be performed automatically by the method via one or more of the switches 201S, 221S, and 222S. Additionally or alternatively, one or more electrical connections may be manually provided/reconfigured, such as by manually connecting a shorting cable/plug by which the extraction plate 221 is connectable to ground GND and/or by manually disconnecting one or more cables/plugs.

After the providing/reconfiguring operation(s) of Block 411', the method may confirm charged-particle generation in the instrument 10 by coupling (Block 412') the resistor 201 that is external to the vacuum chamber 210 to charged-particle current 230C generated in the vacuum chamber 210. The operation(s) of Block 412' may also include measuring an electrical response by the resistor 201 to the charged-particle current 230C. In particular, the charged-particle current 230C passing through the resistor 201 provides the voltage 201V response that can be measured. A value of the charged-particle current 230C may then be determined using Ohm's law. Moreover, as described herein with respect to FIG. 2B, a resistance value of the resistor 201 may be between 10 kΩ and 100 MΩ.

The operations of FIG. 4B are not limited to being performed while the chamber 210 is in/under vacuum pressure. Rather, in some embodiments, a method may include venting the system, making the electrical connections at atmospheric pressure, and then testing/measuring after the system pumps down.

Figure 4C:
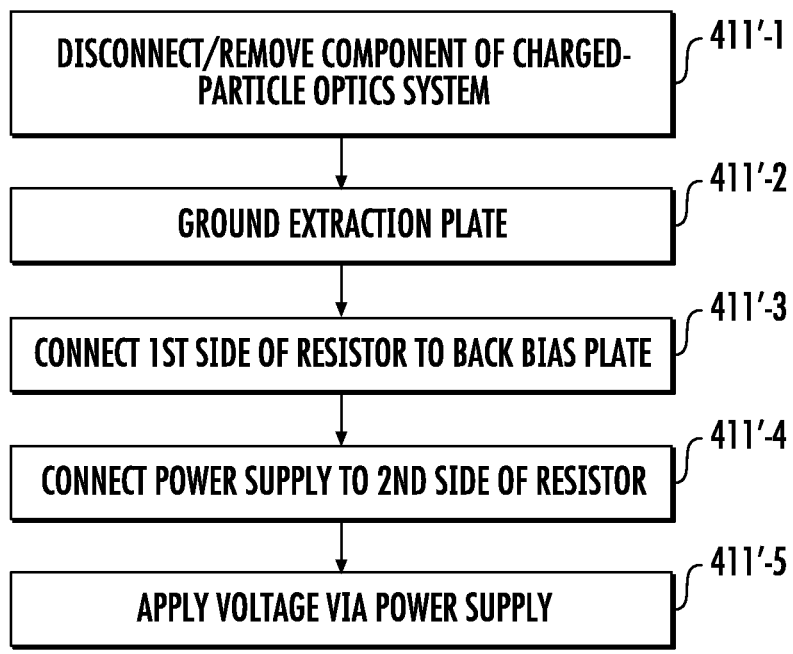

Referring to FIG. 4C, the providing/reconfiguring operation(s) of Block 411' of FIG. 4B may include multiple operations. For example, the providing/reconfiguring (Block 411') of the electrical connections to the charged-particle optics system 220 may include grounding, or applying a voltage to, adjacent ion optics screens or plates of the charged-particle optics system 220. As an example, the providing/reconfiguring operations may include grounding (Block 411'-2) the extraction plate 221 of the charged-particle optics system 220 while the extraction plate 221 is in the vacuum chamber 210. The providing/reconfiguring operations may also include connecting (Block 411'-3) a first side of the resistor 201 to the back bias plate 222 of the charged-particle optics system 220 while the back bias plate 222 is in the vacuum chamber 210 and while the resistor 201 is external to the vacuum chamber 210. Moreover, the providing/reconfiguring operations may include connecting (Block 411'-4) the power supply 202 to a second side of the resistor while the power supply 202 is external to the vacuum chamber 210.

After the operations of Block 411'-2, Block 411'-3, and Block 411'-4, which can be performed in any order, the method may include applying (Block 411'-5) a voltage via the power supply 202 while the power supply 202 is external to the vacuum chamber 210. Before the method applies (Block 411'-5) the voltage, the providing/reconfiguring operations of Block 411' may include disconnecting (Block 411'-1) a cable attached to a component of the charged-particle optics system 220 other than the extraction plate 221 and the back bias plate 222. The disconnecting of Block 411'-1 may, in some embodiments, be performed before placing the chamber 210 in/under vacuum pressure. Additionally or alternatively, the component (e.g., one or more downstream charged-particle optics components) may be removed from the charged-particle optics system 220. For example, a deflector portion/component (e.g., the deflector plate 223) of the charged-particle optics system 220 may be removed, and the charged-particle current 230C may be measured while the deflector portion 223 is absent.

In some embodiments, the providing/reconfiguring operation(s) of Block 411' may include providing a first state of electrical connections to the charged-particle optics system 220, such as by performing one or more of the operations of Block 411'-1, Block 411'-2, Block 411'-3, and Block 411'-4. Moreover, the state of electrical connections to the charged-particle optics system 220 before the providing/reconfiguring operation(s) of Block 411' may be a different second state, such as a state that precedes/lacks one or more of the operations of Block 411'-1, Block 411'-2, Block 411'-3, and Block 411'-4.

Figure 4D:
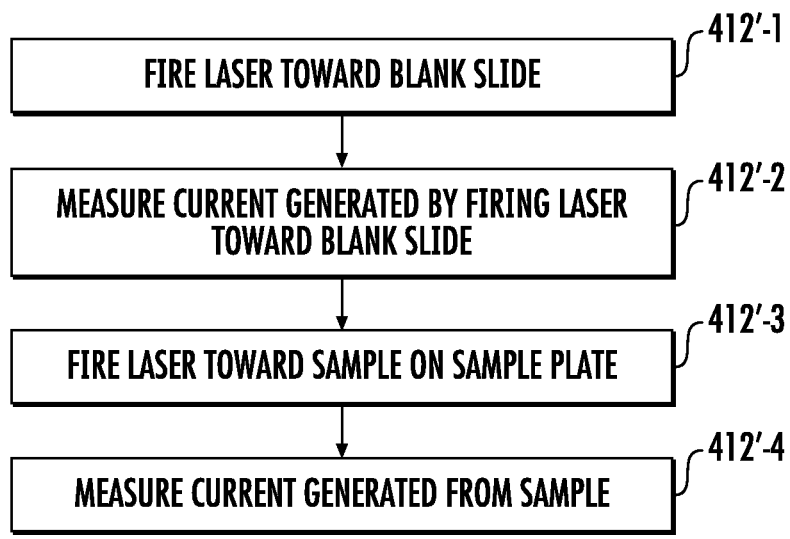

Referring to FIG. 4D, the operation(s) of Block 412' of FIG. 4B may include multiple operations. For example, the operations may include firing (Block 412'-3) the laser 20 of the instrument 10 toward the sample plate 230 that is in the vacuum chamber 210, while the extraction plate 221 is grounded, while first and second sides of the resistor 201 are connected to the back bias plate 222 and the power supply 202, respectively, and while the power supply 202 is applying a voltage. In particular, the laser 20 may fire toward a sample that is on the sample plate 230. The method may then include measuring (Block 412'-4), via the resistor 201, the current 230C generated by the firing the laser 20 toward the sample. In particular, the current 230C may be determined based on a measurement of the voltage 201V response to the current 230C passing through the resistor 201.

Moreover, the operations may include firing (Block 412'-1) the laser 20 toward a blank slide that is free of any samples, and measuring (Block 412'-2), via the resistor 201, any current generated by the firing the laser 20 toward the blank slide, before the firing (Block 412'-3) of the laser 20 toward the sample. For example, the operation(s) of Block 412'-2 may include determining whether a measurable current generated by the firing (Block 412'-1) the laser 20 toward the blank slide passes through the resistor 201. In some embodiments, the respective measurements/results of the operations of Block 412'-4 and Block 412'-2 may be compared to determine the magnitude/impact of (a) ionization of a sample relative to (b) firing on a blank slide. For example, the operations of Block 412'-4 and Block 412'-2 may measure first and second electrical responses (e.g., voltage responses), respectively, by the resistor 201, which may then be compared with each other and/or with predetermined value(s). In the case of the blank slide, as an electrical response may not be measurable, the absence of a measurable electrical response may be detected. Moreover, in some embodiments, the operation(s) of Block 412'-1 (and/or Block 412'-2) may be performed after the operation(s) of Block 412'-3 (and/or Block 412'-4).

Figure 4E:
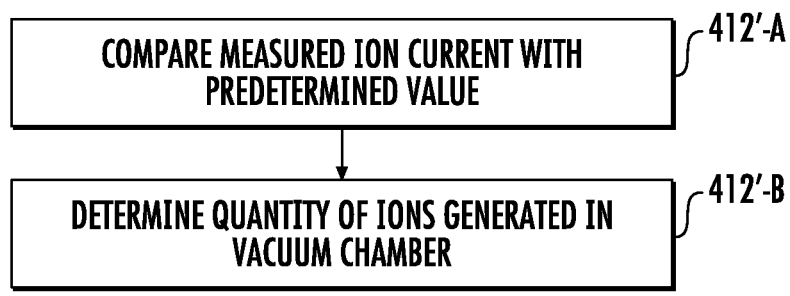

Referring to FIG. 4E, the charged particles described with respect to FIG. 4B may be the ions 230I. As shown in FIG. 4E, the operation(s) of Block 412' of FIG. 4B may include determining (Block 412'-B) a quantity of the ions 230I generated in the chamber 210, based on a comparison (Block 412'-A) of the measured current 230C with a predetermined value. The operations of FIG. 4E may be performed either in addition to, or as an alternative to, the operations of FIG. 4D.

Figure 5A:
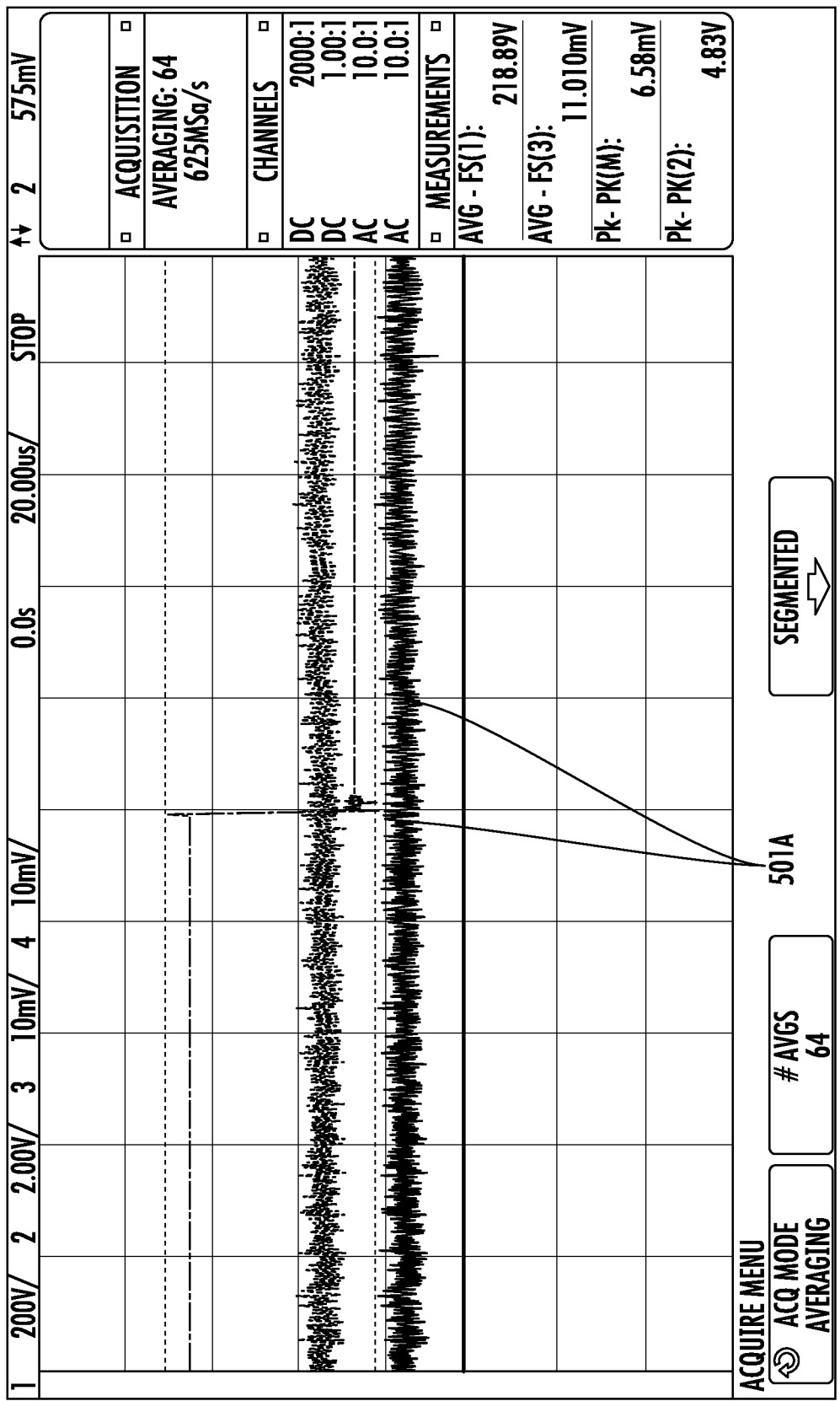
FIG. 5A illustrates a graph of oscilloscope traces for an instrument firing on a blank slide, according to embodiments of the present invention.

FIG. 5A illustrates a graph of oscilloscope traces for the instrument 10 firing on a blank slide. As shown in FIG. 5A, the response 501A of the CVR voltage 201V is flat (i.e., not measurable or noticeable) when firing on a blank slide.

Figure 5B:
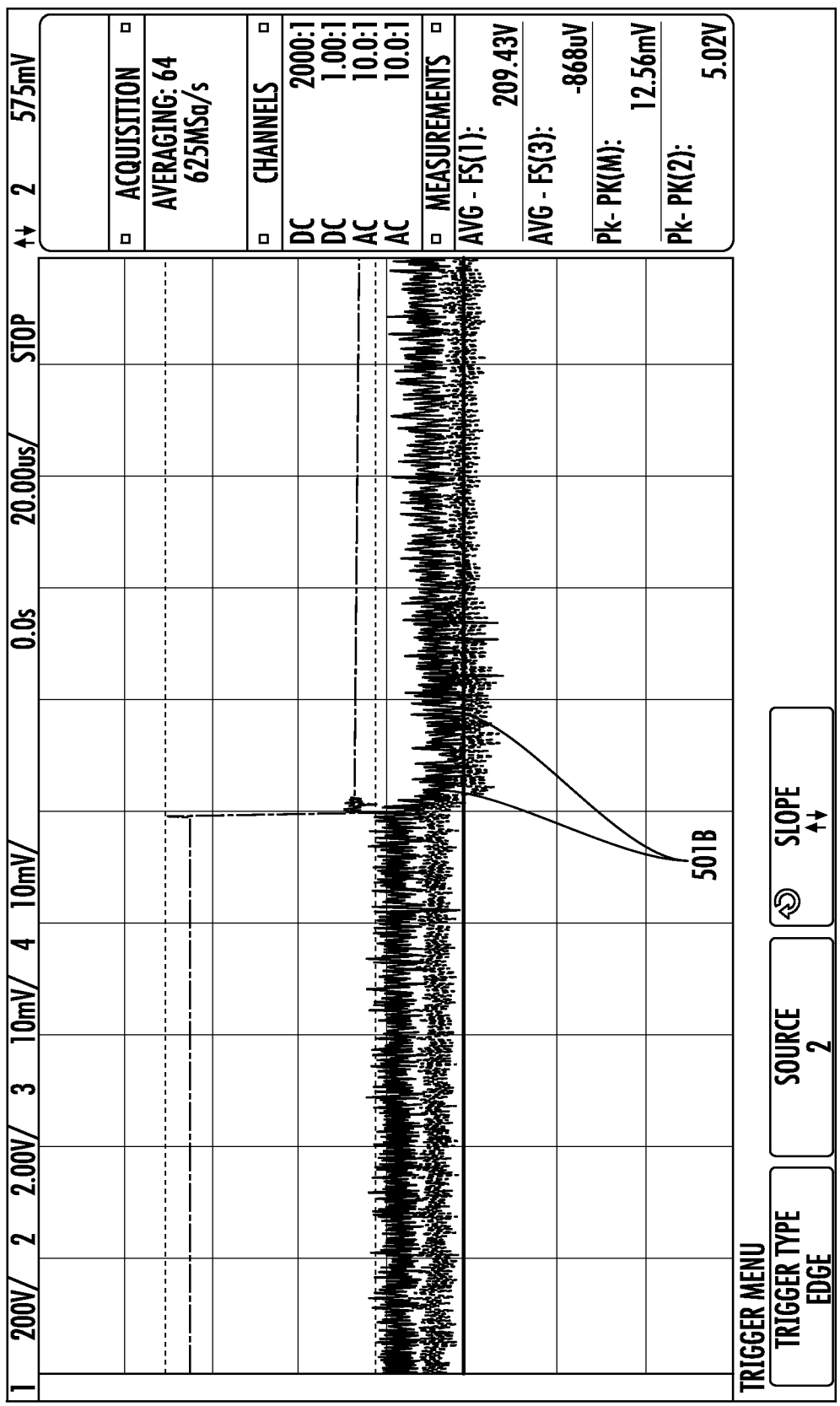
FIG. 5B illustrates a graph of oscilloscope traces for an instrument firing on a sample slide, according to embodiments of the present invention.

FIG. 5B illustrates a graph of oscilloscope traces for the instrument 10 firing on the sample slide 230 having samples thereon. In this example, the instrument 10 is firing on samples of ATCC 8739 *E. coli*. As shown in FIG. 5B, the response 501B of the CVR voltage 201V is measurable/noticeable when firing on the samples. This stands in contrast with the flat response 501A when firing on the blank slide in FIG. 5A.

Figure 6:
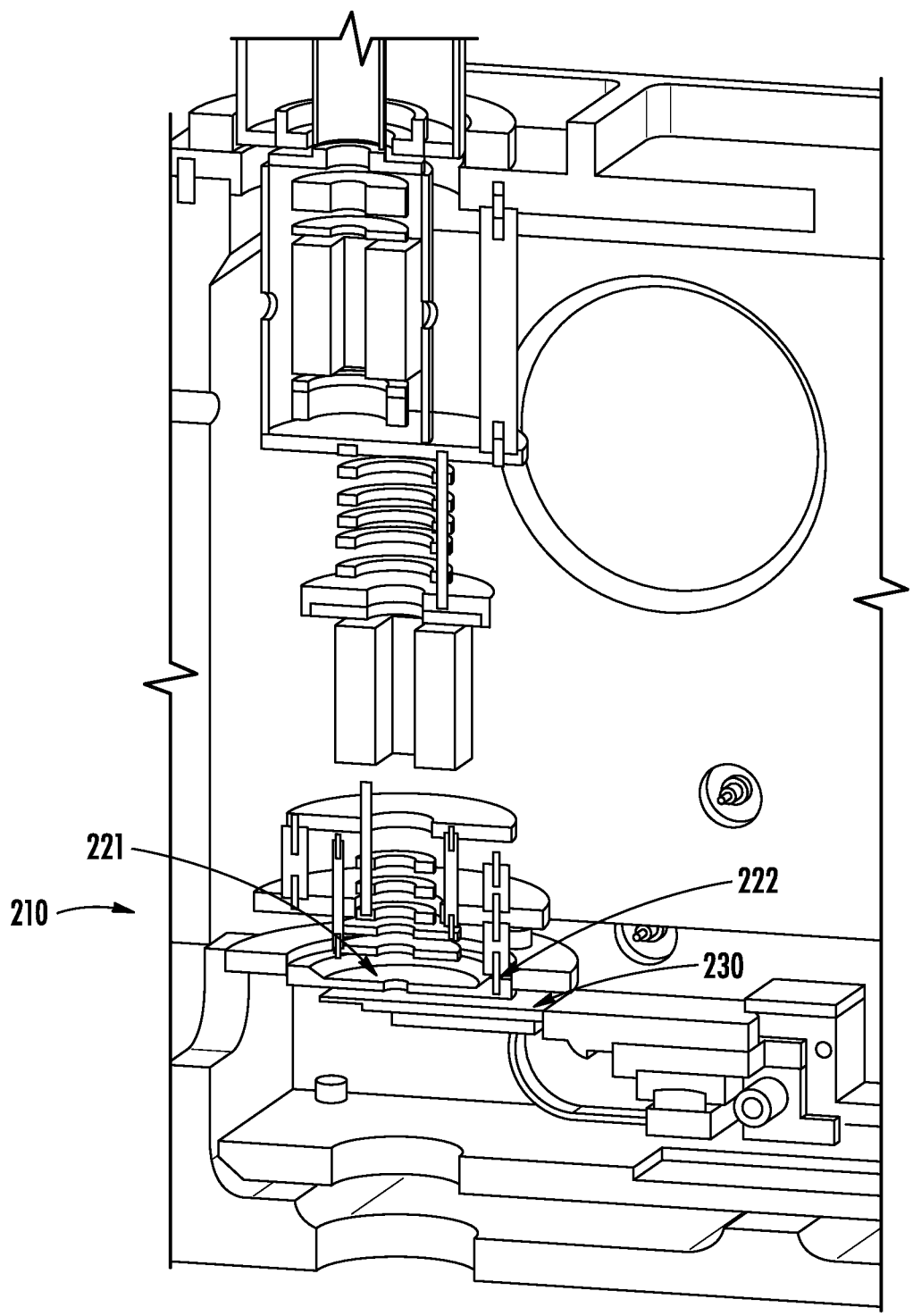
FIG. 6 illustrates a partial section perspective view inside the chamber of FIGS. 2A and 2B, according to embodiments of the present invention.

FIG. 6 illustrates a perspective view inside the chamber 210 of FIGS. 2A and 2B. This view illustrates the sample plate 230, as well as the extraction plate 221 and the back bias plate 222.

In some embodiments, the sample(s) on the sample plate 230 may include a biosample from a patient, and analysis of the sample can be carried out by the instrument 10 to identify whether a defined protein or microorganism, such as bacteria, is in the sample for medical evaluation of the patient. For example, the instrument 10 may be a mass spectrometer 10M, and the analysis can identify whether any of about 150 (or more) different defined species of bacteria is in a sample, based on obtained spectra. The target mass range can be between about 2,000-20,000 Dalton.

Figure 7:
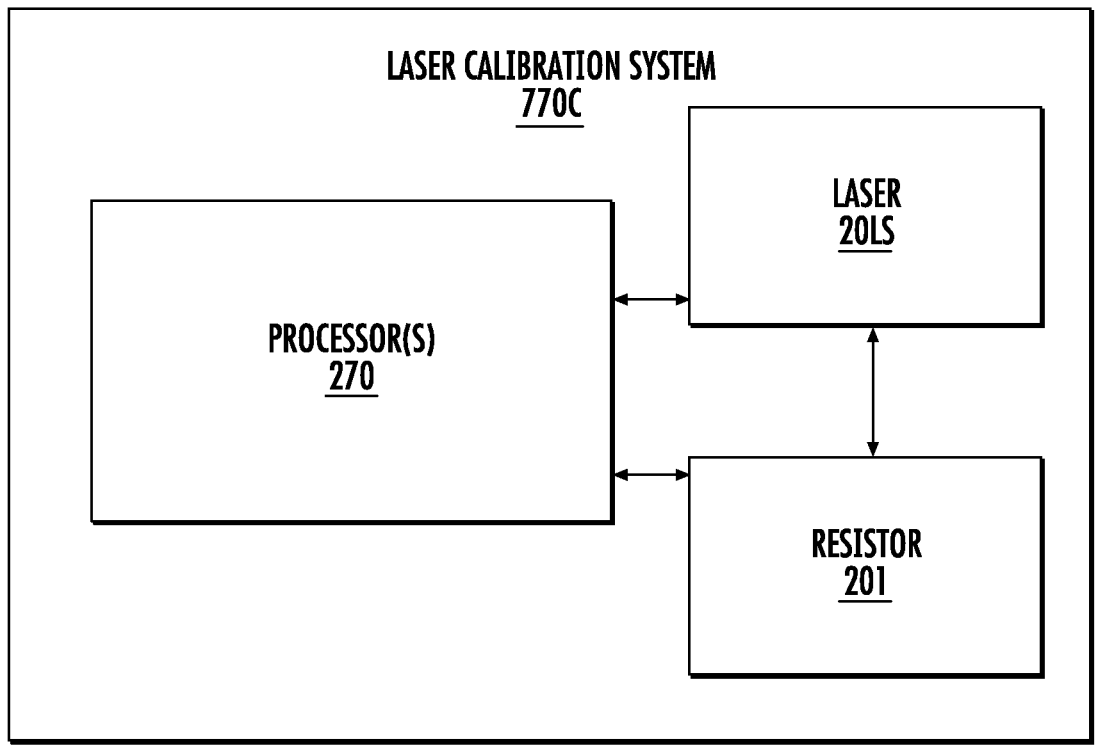
FIG. 7 illustrates a block diagram of a resistor connected to a processor and a laser source for the calibration of laser energy and/or laser focusing, according to embodiments of the present invention.

FIG. 7 illustrates a block diagram of a resistor 201 in communication with processor(s) 270 and a laser source 20LS for the calibration of laser energy and/or laser focusing. The processor(s) 270 may receive/process data/signals resulting from an electrical response by the resistor 201 to current generated by light from the laser 20LS, and the processor(s) 270 may responsively control the laser 20LS to adjust its laser energy and/or laser focus. The combination/communication of the processor(s) 270 with the laser 20LS and the resistor 201 to control calibration of the laser 20LS may provide a laser calibration system 770C. Moreover, as described herein, the resistor 201 may be coupled to a power supply 202, which may also be controlled by the processor(s) 270.

Figure 8:
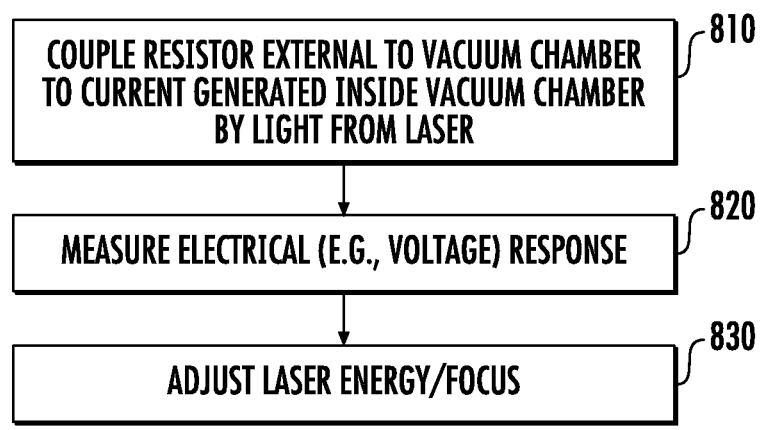
FIG. 8 illustrates a flowchart of example methods for the calibration of laser energy and/or laser focusing, according to embodiments of the present invention.

FIG. 8 illustrates a flowchart of example method(s) for the calibration of laser energy and/or laser focusing. The method(s) may including coupling (Block 810) the resistor 201, which is external to the vacuum chamber 210, to current (e.g., the charged-particle current 230C) that is generated inside the vacuum chamber 210 by light 20L from the laser 20LS. Accordingly, the term "coupling," as used herein with respect to the resistor 201 and current, may refer to firing the laser LS at a target 230T that is in the vacuum chamber 210 to generate current. Moreover, the method(s) may include adjusting (Block 830) the laser energy and/or the laser focus of the laser 20LS, in response to a measurement (Block 820) of an electrical response, such as a voltage 201V response, by the resistor 201 to the current. For example, the processor(s) 270 may compare a measured electrical response with a predetermined value (e.g., a threshold value or range), and perform the adjusting (Block 830) in response to deviation from the predetermined value.

The present invention advantageously provides for directly measuring the ion current 230C generated from a sample. Conventional systems, by contrast, may only provide indirect feedback about ion current based on the intensity of peaks in mass spectra. Accordingly, in conventional systems, if no mass spectra are being generated, it may be difficult to determine whether ions are being generated, arriving at a detector, and/or resulting in an output signal by a detector. The measurement of the current 230C by the present invention, however, may be performed when no mass spectra are generated.

The present invention also advantageously provides for measuring the ion current 230C without requiring additional hardware (e.g., additional diagnostic hardware) inside the chamber 210. Rather, any additional hardware (e.g., the resistor 201, the power supply 202, and the switches 201S, 221S, and 222S) used to implement the methods (e.g., as a diagnostic) of the present invention for the instrument 10 can be external to the chamber 210.

Figure 9A:
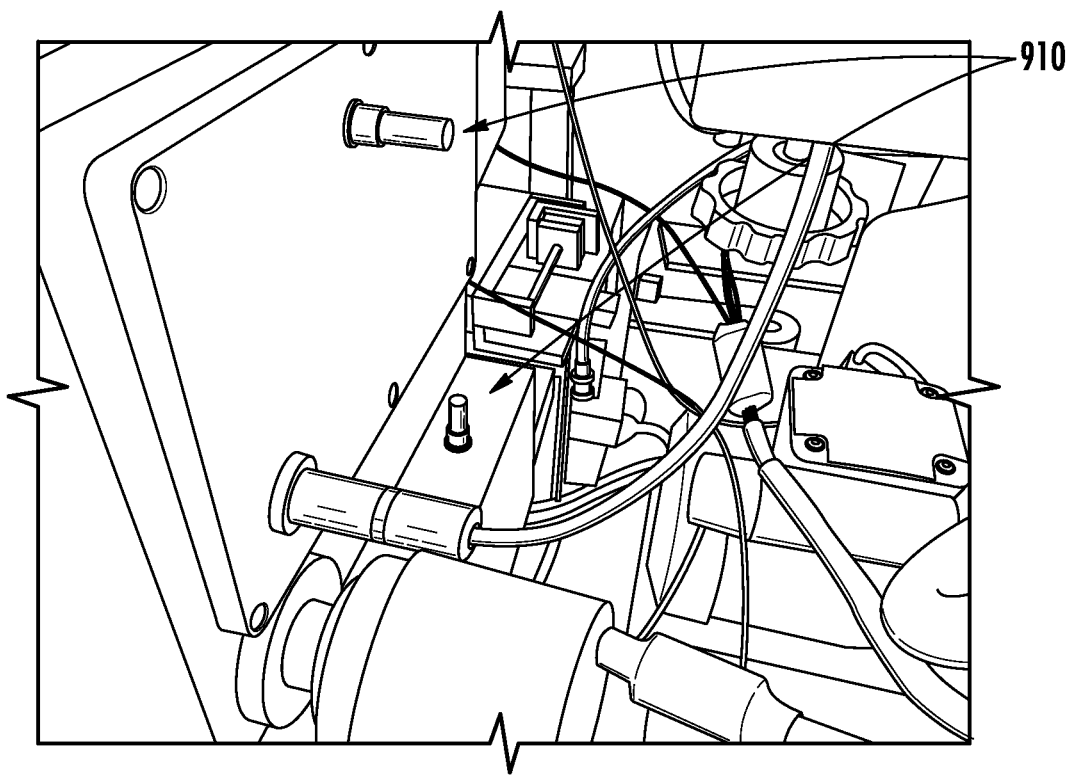
FIG. 9A illustrates Safe High Voltage (SHV) feedthroughs that can be used with an instrument, according to embodiments of the present invention.

FIG. 9A illustrates Safe High Voltage (SHV) vacuum feedthroughs 910 that can be used with the instrument 10. For example, the SHV feedthroughs 910 may be PASTERNACK® PE4500 SHV jack bulkhead hermetically sealed terminal connectors. In some embodiments, one of the feedthroughs 910 may be an extraction pulse SHV feedthrough and another of the feedthroughs 910 may be a back bias SHV feedthrough.

Figure 9B:
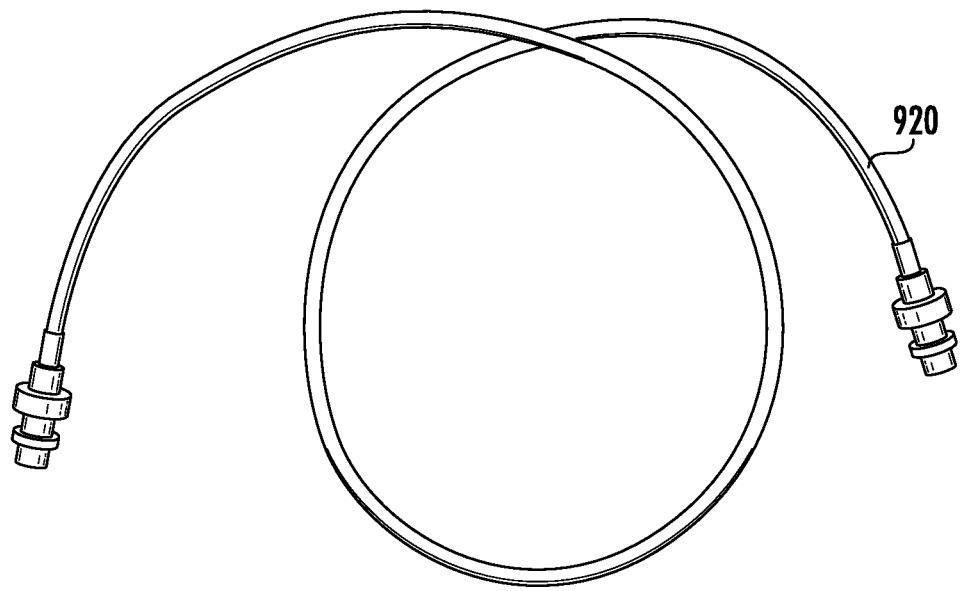
FIG. 9B illustrates an SHV patch cable that can be used with an instrument, according to embodiments of the present invention.

FIG. 9B illustrates an SHV patch cable 920 that can be used with the instrument 10. For example, the SHV patch cable 920 may be connected between a resistor measurement box 201 and the atmospheric side of a back bias SHV feedthrough 910 to connect one side of the resistor 201 to the back bias plate 222.

The following is one non-limiting example of the methods/diagnostic described herein. To assist in the troubleshooting of mass spectrometry instruments/systems, the following procedure was developed to test the occurrence of ionization at a sample. An underlying principle of the procedure involves using a charge collection plate and a CVR. Existing connections of the instrument/system are modified so that a lower removable portion of the ion optics of the instrument/system may facilitate the diagnostic. The diagnostic may include the following operations:

1. Set the laser optics positions to those specified in the instrument/system tuning procedures.
2. Turn off all high voltages, to protect against damaging the instrument 10.
3. Vent the vacuum system.
4. Inside the vacuum chamber 210, disconnect all cables attached to the removable ion optics 220, with the exception of the back bias and extraction pulse cables. The remaining connections should not go through any voltage dividers in the vacuum chamber 210. Moreover, ensure that unused cables are not shorted to a wall of the vacuum chamber 210.
5. Remove the deflector portion 223 of the ion optics assembly 220. Leave the lower portion of the ion optics assembly 220 in place.
6. Close the door and start pumping down the vacuum chamber 210 to operation pressure (less than $3\times10^{-6}$ Torr).
7. Disconnect the extraction pulse cable from the atmospheric side of the extraction pulse Safe High Voltage (SHV) feedthrough 910.
8. Attach a shorting plug to the atmospheric side of the extraction pulse SHV feedthrough 910. This grounds the extraction plate 221.
9. Disconnect the back bias cable from the atmospheric side of the back bias SHV feedthrough 910.
10. Connect an SHV patch cable 920 between a resistor measurement box 201 and the atmospheric side of the back bias SHV feedthrough 910. This connects one side of the resistor 201 (e.g., a 10 kV, 1 Watt, 10 MΩ+/−5% resistor) to the back bias plate 222.
11. Connect a DC power supply 202 capable of −200 V to the remaining side of the resistor measurement box 201. Note that the polarity is negative for the inner conductor. It may be desirable to use a power supply that can been controlled via a Graphical User Interface (GUI). A benchtop power supply, however, may be used. In some embodiments, a power supply of the detector 250 may be used. An adapter or a different termination may be used with the power supply of the detector 250, as this power supply may be terminated in Miniature High Voltage (MHV).
12. Connect standard 10× oscilloscope probes 310 rated for >300 V to either side of the resistor 201 in the measurement box. The corresponding channels on the oscilloscope may be Alternating Current (AC) coupled.
13. On the oscilloscope, create a math function to subtract the two probe voltages. This creates a differential voltage measurement (the CVR voltage 201V) across the resistor 201.
14. Connect a cable to the laser sync output of the laser 20. This may be achieved via a test point or connector on the circuit boards. For example, a connector of a timing board may be used.
15. Set the oscilloscope to trigger on the leading edge of the laser sync signal. This is shown as a falling-edge trigger in FIG. 5A, but may be different depending on electronics design.
16. Insert a blank slide with no samples into the instrument 10 and pump down to operating pressure.
17. Set all high voltages in the instrument 10 to be 0 V during acquisition, to protect against damaging the instrument 10.
18. Set the DC power supply 202 to −200 V. This may be easier to set with no averaging on the oscilloscope.
19. Set the oscilloscope to average 64 events. The signal may be very noisy without averaging. The averaging should make the signal more distinguishable from noise.
20. Begin firing the laser 20 on the slide and raster, if possible. The laser energy at the slide should be approximately 5 microJoules (μJ). This was achieved with a laser power of 20 μJ from the laser 20. The 5 μJ value is based on measurements of 1.5 μJ at the sample for 6 μJ from the laser 20. When using a blank slide, the math function representing the differential voltage 201V across the resistor 201 should not change at a laser trigger event, as shown in FIG. 5A. In FIG. 5A, channel 1 is the voltage of the DC power supply 202, channel 2 is the laser sync event, channel 3 is the voltage probe 310 on the power supply 202 side of the resistor 201, and channel 4 is the voltage probe 310 on the vacuum chamber 210 side of the resistor 201.
21. Discontinue firing on the blank slide.
22. Replace the blank slide with a full slide of ATCC 8739 *E. coli* and pump down to operating pressure. These samples can be from either suspension or manual deposits. In some embodiments, fresh samples may be suspended in matrix.
23. Set all high voltages in the instrument 10 to 0 V during acquisition, to protect against damaging the instrument 10.
24. Set the DC power supply 202 to −200 V. This may be easier to set with no averaging on the oscilloscope.
25. Set the oscilloscope to average 64 events. The signal may be very noisy without averaging. The averaging should make the signal more distinguishable from noise.
26. Begin firing the laser 20 on the slide and raster, if possible. The laser energy at the sample should be approximately 5 microJoules (μJ). This was achieved with a laser power of 20 μJ from the laser 20. The 5 μJ value is based on measurements of 1.5 μJ at the sample for 6 μJ from the laser 20. When using a slide with samples, the math function representing the differential voltage 201V across the resistor 201 should change by approximately 10 milliVolts (mV) during a laser trigger event, as shown in FIG. 5B.

This change in voltage on the CVR 201 is proportional to the ion current 230C collected in the instrument 10 via Ohm's law. In FIG. 5B, channel 1 is the voltage of the DC power supply 202, channel 2 is the laser sync event, channel 3 is the voltage probe 310 on the power supply 202 side of the resistor 201, and channel 4 is the voltage probe 310 on the vacuum chamber 210 side of the resistor 201.

27. Discontinue firing on the E. coli samples.

28. Remove the slide of E. coli samples from the instrument 10.

In the figures, certain layers, components, or features may be exaggerated for clarity, and broken lines illustrate optional/removable features or operations unless specified otherwise. The terms "FIG." and "Fig." are used interchangeably with the word "Figure" in the application and/or drawings. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, although the terms "first," "second," etc. may be used herein to describe various elements, components, regions, layers, and/or sections, these elements, components, regions, layers, and/or sections should not be limited by these terms. These terms are only used to distinguish one element, component, region, layer, or section from another region, layer or section. Thus, a "first" element, component, region, layer, or section discussed below could be termed a "second" element, component, region, layer, or section without departing from the teachings of the present invention.

Spatially relative terms, such as "beneath," "below," "bottom," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass orientations of above, below and behind. The device may be otherwise oriented (rotated 90° or at other orientations) and the spatially relative descriptors used herein interpreted accordingly.

The term "about" refers to numbers in a range of +/−20% of the noted value.

As used herein, the singular forms "a," "an," and "the" are intended to include the plural forms as well, unless expressly stated otherwise. It will be further understood that the terms "includes," "comprises," "including," and/or "comprising," when used in this specification, specify the presence of stated features, steps, operations, elements, and/or components, but do not preclude the presence or addition of one or more other features, steps, operations, elements, components, and/or groups thereof. It will be understood that when an element is referred to as being "connected" or "coupled" to another element, it can be directly connected or coupled to the other element or intervening elements may be present. As used herein, the term "and/or" includes any and all combinations of one or more of the associated listed items. Moreover, the symbol "/" has the same meaning as the term "and/or."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

In some embodiments, the mass spectrometer 10M is configured to obtain an ion signal from a sample that is in a mass range of about 2,000 to about 20,000 Dalton.

The term "sample" refers to a substance undergoing analysis and can be any medium within a wide range of molecular weights. In some embodiments, the sample is being evaluated for the presence of microorganisms such as bacteria or fungi. The sample, however, can be evaluated for the presence of other constituents, including toxins or other chemicals.

The term "table top" refers to a relatively compact unit that can fit on a standard table top or counter top or occupy a footprint equivalent to a table top, such as a table top that has width-by-length dimensions of about 1 foot by 6 feet, for example, and which typically has a height dimension that is between about 1-4 feet. In some embodiments, the instrument/system resides in an enclosure or housing of 28 inches-14 inches (W)×28 inches-14 inches (D)×38 inches-28 inches (H). The flight tube 240 may have a length of about 0.8 meters (m). In some embodiments, longer or shorter lengths may be used. For example, the flight tube 240 may have a length that is between about 0.4 m and about 1 m.

The foregoing is illustrative of the present invention and is not to be construed as limiting thereof. Although a few example embodiments of this invention have been described, those skilled in the art will readily appreciate that many modifications are possible in the example embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed is:

1. A method to confirm charged-particle generation in a mass spectrometer, the method comprising:
providing electrical connections to a charged-particle optics system of the mass spectrometer while the charged-particle optics system is in a chamber;
receiving, by an electrical component comprising an impedance, charged-particle current that is generated in the chamber; and
measuring an electrical response by the electrical component to the charged-particle current,
wherein providing the electrical connections to the charged-particle optics system comprises:
connecting a power supply to the electrical component while the power supply is external to the chamber; and applying a voltage via the power supply while the power supply is external to the chamber.

2. The method of claim 1,
wherein the electrical component comprises a resistor that is external to the chamber,
wherein the impedance comprises a resistance value of the resistor between 10 kiloOhms (kΩ) and 100 MegaOhms (MΩ),
wherein providing the electrical connections to the charged-particle optics system further comprises:
grounding an extraction plate of the charged-particle optics system; and
connecting a first side of the resistor to a back bias plate of the charged-particle optics system while the back bias plate is in the chamber and while the resistor is external to the chamber, and
wherein connecting the power supply to the electrical component comprises connecting the power supply to a second side of the resistor while the power supply is external to the chamber.

3. The method of claim 2, wherein the resistance value of the resistor is between 100 kΩ and 100 MΩ.

4. The method of claim 2, further comprising:
disconnecting a cable attached to a component of the charged-particle optics system other than the extraction plate and the back bias plate.

5. The method of claim 2, further comprising:
firing a laser of the mass spectrometer toward a sample plate that is in the chamber to generate the charged-particle current in the chamber, while the extraction plate is grounded, while the first and second sides of the resistor are connected to the back bias plate and the power supply, respectively, and while the power supply is applying the voltage.

6. The method of claim 5,
wherein firing the laser comprises firing the laser toward a sample on the sample plate, and
wherein the method further comprises:
firing the laser toward a blank slide that is free of any samples; and
determining whether a measurable current generated by the firing the laser toward the blank slide passes through the resistor.

7. The method of claim 1, further comprising removing a downstream charged-particle optics component of the charged-particle optics system, wherein coupling the electrical component to the charged-particle current is performed while the downstream charged-particle optics component is removed.

8. The method of claim 1,
wherein the charged-particle current comprises a measured ion current, and
wherein the method further comprises determining a quantity of ions that are generated in the chamber by comparing the measured ion current with a predetermined value.

9. The method of claim 1, wherein the charged-particle current comprises a current of an electron beam that is generated in the chamber.

10. The method of claim 1,
wherein coupling comprises firing a laser of the mass spectrometer toward a target that is in the chamber to generate the charged-particle current, and
wherein the method further comprises adjusting laser energy and/or laser focus of the laser in response to the measuring the electrical response by the electrical component to the charged-particle current.

11. The method of claim 1, wherein providing the electrical connections is performed while the chamber is under vacuum pressure.

12. A method to confirm charged-particle generation in a mass spectrometer, the method comprising:
providing electrical connections to a charged-particle optics system of the mass spectrometer while the charged-particle optics system is in a chamber;
receiving, by an electrical component comprising an impedance, charged-particle current that is generated in the chamber; and
measuring an electrical response by the electrical component to the charged-particle current,
wherein the method further comprises determining that no signal is being generated by the mass spectrometer, and
wherein providing the electrical connections to the charged-particle optics system comprises providing a first state of the electrical connections that is different from a previous second state of the electrical connections, in response to the determining that no signal is being generated by the mass spectrometer.

13. A method to confirm ionization in a mass spectrometer, the method comprising:
grounding a first plate or screen of an ion optics system of the mass spectrometer while the first plate or screen is in a chamber that is under vacuum pressure;
connecting a first side of an electrical component comprising an impedance to a second plate or screen of the ion optics system while the second plate or screen is in the chamber;
connecting a power supply to a second side of the electrical component while the power supply is external to the chamber;
applying a voltage via the power supply while the power supply is external to the chamber;
firing a laser of the mass spectrometer toward a sample plate of the mass spectrometer, while the first plate or screen is grounded, while the first and second sides of the electrical component are connected to the second plate or screen and the power supply, respectively, and while the power supply is applying the voltage; and
receiving, by the electrical component, ion current that is generated from a sample that is on the sample plate while the sample plate is in the chamber.

14. The method of claim 13, wherein:
the electrical component comprises a resistor that is external to the chamber;
the impedance comprises a resistance value of the resistor between 100 kiloOhms (kΩ) and 100 MegaOhms (MΩ);
the method further comprises determining that no signal is being generated by the mass spectrometer;
the first plate or screen comprises an extraction plate;
the second plate or screen comprises a back bias plate; and
the grounding and the connecting the first side are performed in response to the determining that no signal is being generated by the mass spectrometer.

15. The method of claim 13, further comprising:
measuring a first electrical response by the electrical component to the ion current;
firing the laser toward a blank slide that is free of any sample; and
measuring a second electrical response, or detecting an absence thereof, by the electrical component to the firing the laser toward the blank slide.

16. The method of claim 13, further comprising determining a quantity of ions that are generated by comparing the ion current with a predetermined value.

17. A mass spectrometer comprising:
a chamber comprising:
an ion optics system comprising a first plate or screen and a second plate or screen; and
a sample plate;
a power supply that is external to the chamber; and
an electrical component that is connectable between the second plate or screen and the power supply, wherein the electrical component comprises an impedance and is configured to receive charged-particle current generated in the chamber.

18. The mass spectrometer of claim 17,
wherein the electrical component comprises a resistor that is external to the chamber, and
wherein the impedance comprises a resistance value of the resistor between 10 kiloOhms (kΩ) and 100 MegaOhms (MΩ).

19. The mass spectrometer of claim 18, further comprising a laser configured to fire toward the sample plate, while first and second sides of the resistor are connected to the second plate or screen and the power supply, respectively, and while the power supply is applying a voltage, wherein the resistor is configured to receive ion current generated from a sample that is on the sample plate,
wherein the resistance value of the resistor comprises a predetermined value between 100 kΩ and 100 MΩ, and
wherein the first plate or screen comprises an extraction plate and the second plate or screen comprises a back bias plate.

20. The mass spectrometer of claim 19, further comprising a shorting plug by which the extraction plate is connectable to ground, wherein the laser is configured to fire toward the sample plate while the extraction plate is grounded.

21. The mass spectrometer of claim 19, further comprising a switch by which the extraction plate is switchably connectable to ground,
wherein the switch is external to the chamber, and
wherein the laser is configured to fire toward the sample plate while the extraction plate is grounded.

22. The mass spectrometer of claim 19, further comprising a switch by which the resistor is switchably connectable between the back bias plate and the power supply, wherein the switch is external to the chamber.

23. The mass spectrometer of claim 17, wherein a deflector portion of the ion optics system is removable from the ion optics system.

* * * * *